(12) United States Patent
Sakaguchi

(10) Patent No.: US 6,205,559 B1
(45) Date of Patent: Mar. 20, 2001

(54) METHOD AND APPARATUS FOR DIAGNOSING FAILURE OCCURRENCE POSITION

(75) Inventor: Kazuhiro Sakaguchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/050,854

(22) Filed: Mar. 31, 1998

(30) Foreign Application Priority Data

May 13, 1997 (JP) .................................................. 9-122285

(51) Int. Cl.[7] .............................. H02H 3/05; G01R 31/28
(52) U.S. Cl. .............................. 714/25; 714/33; 714/741
(58) Field of Search .................... 714/25, 26, 33, 714/32, 741

(56) References Cited

U.S. PATENT DOCUMENTS

| | | | |
|---|---|---|---|
| 3,961,250 | 6/1976 | Snethen | 324/73 |
| 5,515,384 | 5/1996 | Horton, III | 371/22.4 |
| 5,987,248 * | 11/1999 | Murayama et al. | 395/704 |
| 5,996,090 * | 11/1999 | Hellerstein | 714/25 |
| 6,016,554 * | 1/2000 | Skrovan et al. | 714/25 |
| 6,044,214 * | 3/2000 | Kimura et al. | 395/500.36 |

FOREIGN PATENT DOCUMENTS

| | | |
|---|---|---|
| 2 623 630 | 5/1989 | (FR) . |
| 61-241672 | 10/1986 | (JP) . |
| 63-305265 | 12/1988 | (JP) . |
| 1-156680 | 6/1989 | (JP) . |
| 4-55776 | 2/1992 | (JP) . |
| 6-120314 | 4/1994 | (JP) . |
| 7-77562 | 3/1995 | (JP) . |

* cited by examiner

*Primary Examiner*—Norman M. Wright
(74) *Attorney, Agent, or Firm*—Foley & Lardner

(57) ABSTRACT

In a failure diagnosing apparatus for a semiconductor integrated circuit device as a semiconductor integrated circuit device (106), an operation of a semiconductor integrated circuit device is simulated using a set of test vectors to produce a simulation result. The semiconductor integrated circuit device is tested using the set of test vectors to produce a test result. Next, a first set of combinations of circuit elements is defined based on a circuit data of the semiconductor integrated circuit device. In this case, the semiconductor integrated circuit device is composed of the circuit elements. A final set of failure candidates is estimated from the first set of combinations based on the simulation result and the test result for each of the test vectors. Then, the final set of failure candidates is outputted.

33 Claims, 36 Drawing Sheets

Fig. 4

| TEST VECTOR No. | A | B | C |
|---|---|---|---|
| 1 | L | L | L |
| 2 | L | H | H |
| 3 | H | H | L |
| 4 | H | L | H |

Fig. 5

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | L | L | L | L | H |
| 4 | H | L | H | L | H | Z | H | H | L | L |

Fig. 6

| TEST VECTOR No. | A | B | C | FUNCTION TEST | IDDQ TEST |
|---|---|---|---|---|---|
| 1 | L | L | L | PASS | PASS |
| 2 | L | H | H | PASS | PASS |
| 3 | H | H | L | PASS | FAIL |
| 4 | H | L | H | PASS | PASS |

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | L | L | L | L | L |
| 4 | H | L | H | L | H | Z | H | H | L | L |

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | L | H |
| 3 | H | H | L | L | H | Z | H | L | L | L |
| 4 | H | L | H | L | L | Z | H | H | L | L |

Fig. 10A

| TEST VECTOR No. | A | B | C | N1 | N2 | N3 | N4 | N5 | N6 | N7 |
|---|---|---|---|---|---|---|---|---|---|---|
| 1 | L | L | L | L | H | H | L | H | H | H |
| 2 | L | H | H | H | L | L | L | L | L | H |
| 3 | H | H | L | L | H | L | L | L | L | L |
| 4 | H | L | H | L | H | Z | H | H | L | L |

Fig. 10B

| | A | B | C | N1 | N2 | N3 | N4 | N5 | N6 | N7 | Vdd |
|---|---|---|---|---|---|---|---|---|---|---|---|
| B | × | | | | | | | | | | |
| C | × | ○ | | | | | | | | | |
| N1 | × | × | × | | | | | | | | |
| N2 | × | × | × | × | | | | | | | |
| N3 | × | × | × | × | ○ | | | | | | |
| N4 | ○ | × | × | ○ | × | × | | | | | |
| N5 | × | × | × | ○ | ○ | ○ | × | | | | |
| N6 | × | × | × | ○ | × | ○ | × | ○ | | | |
| N7 | × | × | × | × | × | × | × | × | ○ | | |
| Vdd | × | × | × | × | × | × | × | × | ○ | ○ | |
| GND | ○ | × | × | × | × | × | ○ | × | × | × | × |

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | L | L | L | L | H |
| 4 | H | L | H | L | Z | Z | H | H | L | L |

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | Z | H | L | L | H |
| 4 | H | L | H | L | H | H | H | H | L | L |

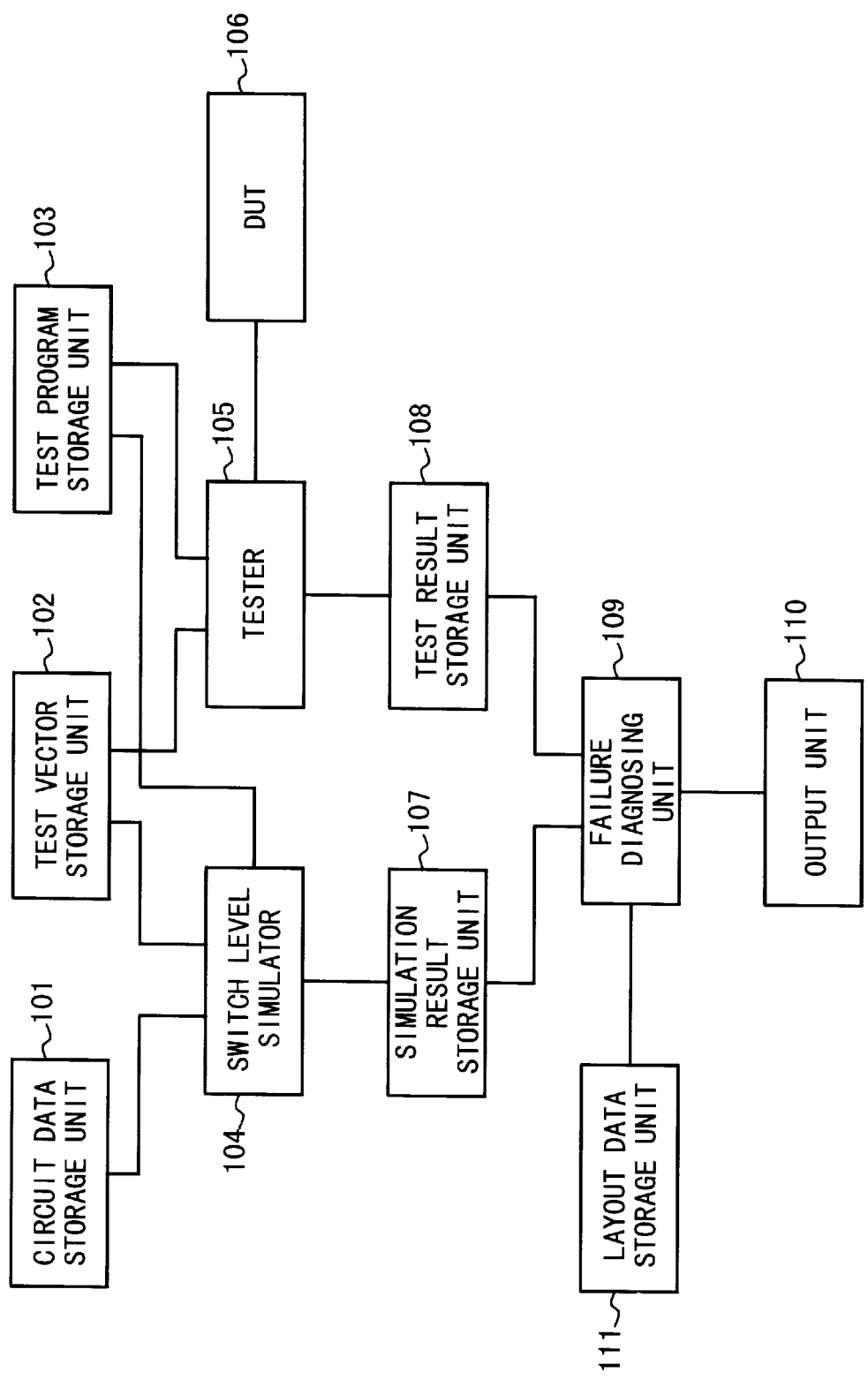

Fig. 18

|      | B | C | N1 | N2 | N3 | N4 | N5 | N6 | N7 | Vdd | GND |
|------|---|---|----|----|----|----|----|----|----|-----|-----|
| Vdd  |   |   |    |    |    |    |    |    |    |     | O   |
| N7   |   |   |    |    |    |    |    |    |    | O   | O   |
| N6   |   |   |    |    |    |    |    |    | O  | X   | O   |
| N5   |   |   |    |    |    |    |    | O  | O  | O   | O   |
| N4   |   |   |    |    |    |    | X  | X  | O  | X   | O   |
| N3   |   |   |    |    |    | X  | X  | X  | X  | X   | O   |
| N2   |   |   |    |    | O  | O  | X  | X  | X  | O   | O   |
| N1   |   |   |    | O  | O  | X  | X  | X  | X  | O   | O   |
| C    |   | X | O  | X  | O  | X  | X  | O  | O  | O   | O   |
| B    | X | O | O  | O  | X  | O  | X  | X  | O  | O   | O   |
| A    | O | X | O  | X  | X  | X  | X  | O  | O  | O   | O   |

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | L | L | L | L | H |
| 4 | H | L | H | L | H | Z | H | H | L | L |

Fig. 26

| TEST VECTOR No. | A | B | C | FUNCTION TEST | IDDQ TEST |
|---|---|---|---|---|---|
| 1 | L | L | L | PASS | PASS |
| 2 | L | H | H | PASS | PASS |
| 3 | H | H | L | PASS | FAIL |
| 4 | H | L | H | PASS | FAIL |

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | L | L | L | L | H |
| 4 | H | L | H | L | H | Z | H | H | L | L |

Fig. 28A

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | H | L | L | L | Z | H |
| 3 | H | H | L | L | L | L | H | H | L | H |
| 4 | H | L | H | L | H | Z | H | H | L | L |

Fig. 28B

| | B | C | N1 | N2 | N3 | N4 | N5 | N6 | N7 | Vdd |
|---|---|---|---|---|---|---|---|---|---|---|
| A | 0 | | | | | | | | | |
| B | | 0 | | | | | | | | |
| C | | | 1 | | | | | | | |
| N1 | | | | 1 | | | | | | |
| N2 | | | | | 1 | | | | | |
| N3 | | | | | | 0 | | | | |
| N4 | | | | | | | 1 | | | |
| N5 | | | | | | | | 1 | | |
| N6 | | | | | | | | | 1 | |
| N7 | | | | | | | | | | 1 |
| Vdd | 0 | 0 | 0 | 0 | 0 | 1 | 0 | 0 | 0 | 0 |
| GND | 0 | 0 | 1 | 1 | 1 | 1 | 1 | 1 | 1 | 1 |

Fig. 29A

| TEST VECTOR No. | A | B | C | N1 | N2 | N3 | N4 | N5 | N6 | N7 |
|---|---|---|---|---|---|---|---|---|---|---|
| 1 | L | L | L | H | H | H | L | H | H | H |
| 2 | L | H | H | H | L | L | L | L | Z | H |
| 3 | H | H | L | L | H | L | L | H | L | L |
| 4 | H | L | H | L | H | Z | H | L | L | L |

Fig. 29B

| | A | B | C | N1 | N2 | N3 | N4 | N5 | N6 | N7 | Vdd |
|---|---|---|---|---|---|---|---|---|---|---|---|
| B | 1 | | | | | | | | | | |
| C | 1 | 0 | | | | | | | | | |
| N1 | 2 | 1 | 1 | | | | | | | | |
| N2 | 1 | 2 | 2 | 1 | | | | | | | |
| N3 | 1 | 2 | 2 | 1 | 0 | | | | | | |
| N4 | 0 | 1 | 1 | 2 | 1 | 1 | | | | | |
| N5 | 1 | 2 | 2 | 1 | 0 | 0 | 1 | | | | |
| N6 | 1 | 1 | 1 | 0 | 0 | 0 | 1 | 0 | | | |
| N7 | 2 | 1 | 1 | 0 | 1 | 1 | 2 | 1 | 0 | | |
| Vdd | 2 | 1 | 1 | 2 | 1 | 1 | 2 | 1 | 0 | 0 | |
| GND | 0 | 1 | 1 | 0 | 2 | 1 | 0 | 1 | 1 | 2 | 2 |

Fig. 31

| TEST VECTOR | SWITCH LEVEL SIMULATION RESULT | FUNCTION TEST | IDDQ TEST |
|---|---|---|---|
| 1 | Res(1) | PASS | PASS |
| 2 | Res(2) | PASS | PASS |
| ... | ... | ... | ... |
| 90 | Res(90) | PASS | FAIL |
| ... | ... | ... | ... |
| 100 | Res(100) | FAIL | PASS |
| 105 | Res(105) | PASS | FAIL |
| ... | ... | ... | PASS |

| A | B | C | N1 | N2 | N3 | N4 | N5 | N6 | N7 |
|---|---|---|----|----|----|----|----|----|----|
| L | L | L | H | H | H | L | H | H | H |
| L | H | H | H | L | L | L | L | Z | H |
| H | H | L | L | H | L | L | L | L | H |
| H | L | H | L | H | Z | H | H | L | L |

Fig. 35

| A | B | C |
|---|---|---|
| L | L | L |
| L | H | H |
| H | H | L |
| H | L | H |

Fig. 36

| A | B | C | N1 | N2 | N3 | N4 | N5 | N6 | N7 |
|---|---|---|----|----|----|----|----|----|----|
| L | L | L | H  | H  | H  | L  | H  | H  | H  |
| L | H | H | H  | L  | L  | L  | L  | N  | H  |
| H | L | H | L  | H  | N  | H  | H  | L  | L  |
| H | H | L | L  | H  | L  | L  | L  | L  | H  |

Fig. 37

| A | B | C | N1 | N2 | N3 | N4 | N5 | N6 | N7 |
|---|---|---|----|----|----|----|----|----|----|
| L | L | L | H | H | H | L | H | H | H |
| L | H | H | H | L | L | L | L | Z | H |
| H | H | L | L | H | L | L | L | L | H |
| H | L | H | L | H | Z | H | H | L | L |

METHOD AND APPARATUS FOR DIAGNOSING FAILURE OCCURRENCE POSITION

BACKGROUND OF THE INVENTION

1. Field of the Invention

The present invention generally relates to a method for diagnosing and estimating a failure occurrence position in a semiconductor integrated circuit device and a failure diagnosing apparatus for the same. More specifically, the present invention relates to a method for diagnosing and estimating a failure occurrence position in a semiconductor integrated circuit device by using an IDDQ test (power source current quiescent test) result of the semiconductor integrated circuit device and a failure diagnosing apparatus for the same.

2. Description of the Related Art

A failure diagnosing apparatus for a semiconductor integrated circuit may be used to specify a failure occurrence position occurred in the semiconductor integrated circuit device, and to confirm a reason of this failure.

For instance, such a failure diagnosing apparatus is described in Japanese Laid Open Patent Disclosure (JP-A-Heisei 4-55776). In the failure diagnosing apparatus, a failure is assumed to occur in a semiconductor integrated circuit device, and an expected value is calculated from a logical simulation result of the semiconductor integrated circuit device. Then, the calculated expected value is compared with a value actually measured by a general-purpose tester such that a failure occurrence position is specified.

However, there is the following problem in the above-described conventional failure diagnosing apparatus for the integrated circuit. That is, when the occurrence of a failure is assumed, since the logic simulation is executed with respect to all of the possible failure factors, the logical simulation for a long time would be necessarily required. Accordingly, the failure diagnosing time would be prolonged.

In addition, in Japanese Laid Open Patent Disclosure (JP-A-Showa 61-241672), the technique is described, in which a test apparatus is composed of simulation means, a pattern generator for converting a test pattern into an electric signal, a test head for applying the electric signal to an IC, comparing means for comparing the output from the IC with an expected value outputted from the simulation means, and fault analysis means for referring to a fault simulation data to determine a fault position when both are not coincident.

In Japanese Laid Open Patent Disclosure (JP-A-Showa 63-305265), the technique is described in which a fault analysis apparatus for a semiconductor integrated circuit is composed of a logic simulator for inputting an input pattern data and a circuit diagram data to output a simulation result, a tester for inputting an input pattern which is edited based on the simulation result, and an output expectation pattern to output a fault output pin number and a test period data, a fault simulator for inputting the input pattern data and the circuit diagram to output a simulation period, a detected fault data and a list of fault detection percentages, and a fault analysis unit for inputting the fault output pin number, a test period data, the simulation period, the detected fault data and the circuit diagram data to output a fault position data.

In Japanese Laid Open Patent Disclosure (JP-A-Heisei 6-120314), the a semiconductor integrated circuit is described to which a test is easily performed. In this reference, a group of test cells is provided on a semiconductor substrate in a matrix manner of m rows and n columns.

In Japanese Laid Open Patent Disclosure (JP-A-Heisei 7-77562), a short circuit failure diagnosing data generating method is described in which a short circuit failure model circuit is inserted between an LSI in which a boundary scanning function is incorporated and a cluster to make a short circuit failure diagnosis possible. The short circuit failure model circuit replaces the short circuit failure of input signals from the cluster into a degenerate failure of signals in the model circuit.

In Japanese Laid Open Patent Disclosure (JP-A-Heisei 1-156680), a fault diagnosing method is described in which a means is provided to calculate a fault detection probability from a logic simulation result by setting an observation probability to 1 only for an external output terminal in which a fault is detected, and setting the observation probability to 0 for other external output terminals, based on fault detection information from an LSI tester, and in which a fault cause is specified by use of the fault detection probability.

SUMMARY OF THE INVENTION

The present invention has been accomplished to solve the above-described conventional problems. Therefore, an object of the present invention is to provide a method for diagnosing and estimating a failure occurrence position in a semiconductor device with a short time period and a failure diagnosing apparatus for the same.

Another object of the present invention is to provide a method for correctly estimating a failure occurrence position in a semiconductor device such that the reliability of a product can be increased, and a failure diagnosing apparatus for the same.

In order to achieve an aspect of the present invention, a method of diagnosing a test circuit device, includes the steps of:

simulating an operation of a test circuit device using a set of test vectors to produce a simulation result;

testing the test circuit device using the set of test vectors to produce a test result;

defining a first set of combinations of circuit elements based on a circuit data of the test circuit device, the test circuit device being composed of the circuit elements;

estimating a final set of failure candidates from the first set of combinations based on the simulation result and the test result for each of the test vectors; and outputting the final set of failure candidates.

In the simulating step, the operation of the test circuit device in a gate level may be simulated based on the circuit data and the test vectors to produce gate level simulation result, and the gate level simulation result may be converted into the simulation result in a transistor level.

Also, in the defining step, the first set of combinations of every two of the circuit elements may be defined based on the circuit data of the test circuit device, and combinations of the circuit elements may be selected based on a layout data of the test circuit device such that any failure does not occur, to define a second set of the selected combinations. Thus, the second set is removed from the first set to redefine the first set of combinations.

The estimating step may include:

(a) determining a third set of combinations of the circuit elements in which a failure does not occur, based on the simulation result for a specific test vector;

(b) removing the third set of combinations from the first set of combinations to redefine the first set of combinations; and (c) repeating the steps (a) and (b) while changing the specific test vector over the test vectors.

Alternatively, the estimating step may include:

(d) determining a third set of combinations of the circuit elements in which a failure does not occur, based on the simulation result for a specific test vector;

(e) removing the third set of combinations from the first set of combinations to redefine the first set of combinations; and (f) repeating the steps (d) and (e) while changing the specific test vector over ones of the test vectors other than a predetermined range of test vectors.

Also, the estimating step may include:

(g) initializing values for the combinations of the first set;

(h) determining a third set of combinations of the circuit elements in which a failure does not occur, based on the simulation result for a specific test vector;

(i) incrementing the values for ones of the combinations of the first set corresponding to the combinations of the third set; and (j) repeating the steps (h) and (i) while changing the specific test vector the test vectors.

Instead, the estimating step may include:

(k) initializing values for the combinations of the first set;

(l) determining a third set of combinations of the circuit elements in which a failure does not occur, based on the simulation result for a specific test vector;

(m) incrementing the values for ones of the combinations of the first set corresponding to the combinations of the third set; and (n) repeating the steps (l) and (m) while changing the specific test vector over ones of the test vectors other than a predetermined range of test vectors.

In this case, the estimating step may include:

determining whether any functional fault is present, based on the test result for each of the test vectors; and when it is determined that any functional fault is present for at least one of the test vectors, determining the predetermined range of test vectors such that the predetermined range of test vectors include the at least one test vector.

Alternatively, the method may further includes the steps of:

determining whether any functional fault is present, based on the test result for each of the test vectors; and stopping the estimating step and the outputting step when it is determined that any functional fault is present for either one of the test vectors. In this case, the estimating step is executed when it is determined that any functional fault is not present for each of the test vectors.

Here, the estimating step may include:

determining a fourth set of circuit elements, which satisfy a first predetermined potential condition, based on the simulation result for the specific test vector;

determining a fifth set of circuit elements, which satisfy a second predetermined potential condition, based on the simulation result for the specific vector; and determining the third set of combinations based on each of the circuit elements of the fourth set and each of the circuit elements of the fifth set.

In this case, the estimating step may include:

determining whether a power source queiscent current fault is present when each of the test vectors is applied, base on the test result;

executing the steps of (a), (b) and (c); (d), (e) and (f); (g), (h), (i) and (j) or (k), (l), (m) and (n) when it is determined that the power source queiscent current fault is not present.

The estimating step further may include:

(o) determining the third set of combinations of the circuit elements in which any failure does not occur, based on the simulation result for a specific test vector, when it is determined that the power source queiscent current fault is present; and (p) calculating a product of the first set and the second set to redefine the calculating result as the first set when it is determined that the power source queiscent current fault is present.

Also, the estimating step may further include relating each of the failure candidates of the final set to a position on a layout of the test circuit device based on a layout data. In such a case, the outputting step includes outputting the final set of failure candidates and the positions.

In this case, the outputting step includes:

displaying the layout;

displaying the positions on the layout; and displaying messages corresponding to the failure candidates of the final set.

The estimating step may include determining the final set of failure candidates in order of combinations having smaller values.

In order to achieve another aspect of the present invention, a failure diagnosing apparatus for a semiconductor integrated circuit device, includes a circuit data storage unit for storing a circuit data of a semiconductor integrated circuit device, a test vector storage unit for storing test vectors for the semiconductor integrated circuit device, a simulating unit for simulating an operation of the semiconductor integrated circuit device using the test vectors to produce a simulation result, a testing unit for testing the semiconductor integrated circuit device using the test vectors to produce a test result, a diagnosing unit for defining a first set of combinations of circuit elements based on the circuit data of the semiconductor integrated circuit device, the semiconductor integrated circuit device being composed of the circuit elements, for estimating a final set of failure candidates from the first set of combinations based on the simulation result and the test result for each of the test vectors, and an output unit for outputting the final set of failure candidates.

BRIEF DESCRIPTION OF THE DRAWINGS

FIG. 4 is a diagram for indicating test vectors used to test the DUT shown in FIG. 3;

FIG. 5 is a diagram for indicating a simulation result obtained when the test vectors shown in FIG. 4 are applied to the DUT shown in FIG. 3;

FIG. 6 is a diagram for representing a test result obtained when the test vectors shown in FIG. 4 are applied to the DUT 106 shown in FIG. 3;

FIG. 10A is a diagram for representing a test result obtained when the test vectors are applied to the DUT and FIG. 10B is a diagram for representing the set of failure candidates used to explain the process of the failure diagnosing apparatus according to the first embodiment of the present invention;

FIG. 15 is a schematic block diagram for representing the structure of a failure diagnosing apparatus according to the third embodiment of the present invention;

FIG. 18 is a diagram for representing the set of failure candidates set used to explain the processes of the failure diagnosing apparatus according to the third embodiment of the present invention;

FIG. 26 is a diagram for showing a test result obtained when the test vectors of FIG. 4 are applied to the DUT indicated in FIG. 3;

FIG. 28A is a diagram for representing a test result obtained when the test vectors are applied to the DUT and FIG. 28B is a diagram for representing the sets of failure candidates used to explain the processes of the failure diagnosing apparatus according to the fifth embodiment of the present invention;

FIG. 29A is a diagram for representing a test result obtained when the test vectors are applied to the DUT and FIG. 29B is a diagram for representing the sets of failure candidates used to explain the processes of the failure diagnosing apparatus according to the fifth embodiment of the present invention;

FIG. 31 is a diagram for representing a simulation result of the switch level simulator 104, functional test of the tester 105, and test result of IDDQ test of the DUT;

FIG. 35 is a diagram for representing a simulation result in a gate level used to describe the process of the failure diagnosing apparatus according to the seventh embodiment of the present invention;

FIG. 36 represents a simulation result in the transistor level used to describe the process of the failure diagnosing apparatus according to the seventh embodiment of the present invention; and FIG. 37 is a diagram for representing a process result by a transistor level converting unit 114 shown in FIG. 32.

DESCRIPTION OF THE PREFERRED EMBODIMENTS

A failure diagnosing apparatus of the present invention will be described below in detail with reference to the attached drawings.

Figure 1:
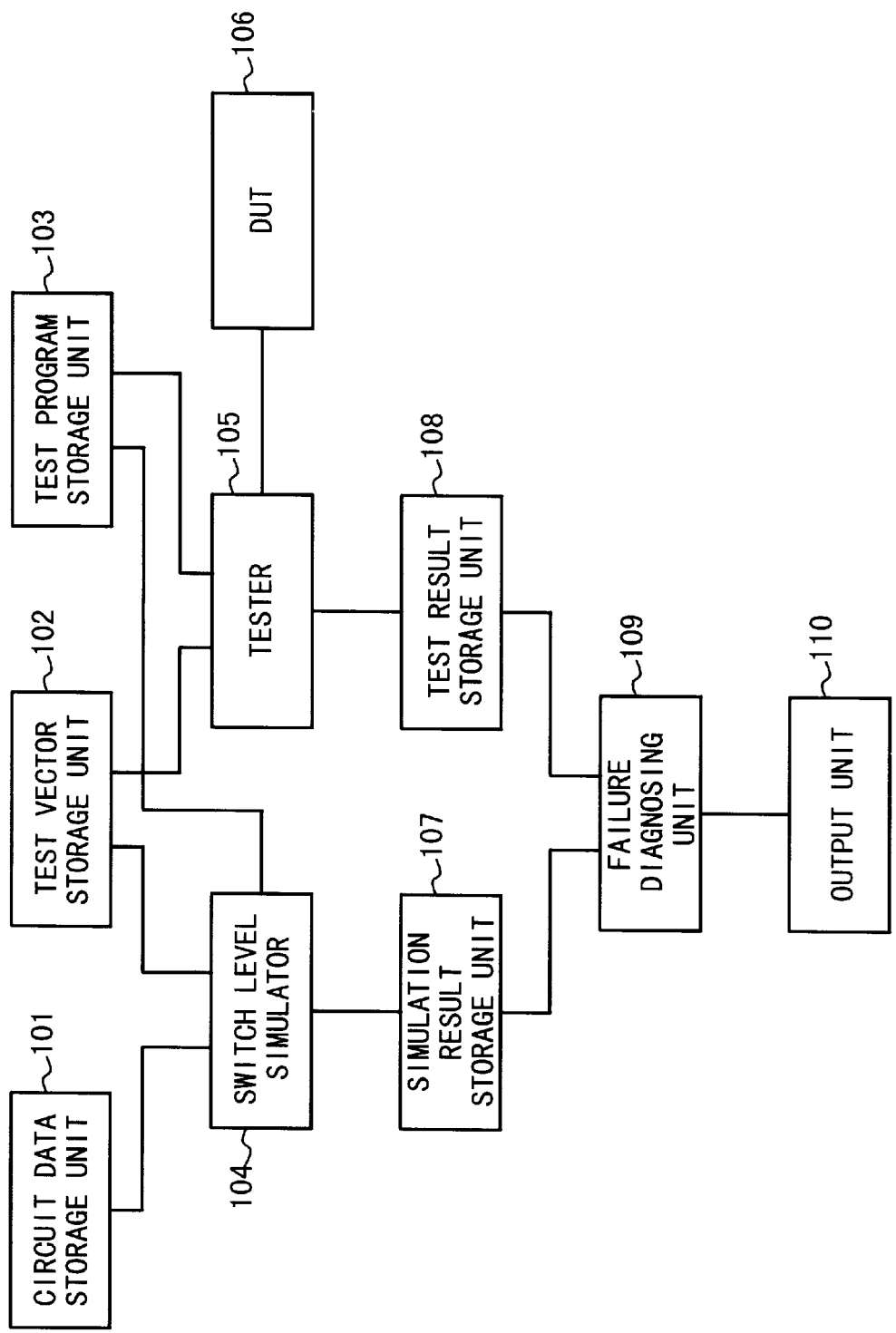
FIG. 1 is a schematic block diagram illustrating the structure of the failure diagnosing apparatus according to the first embodiment of the present invention.

First, the failure diagnosing apparatus according to the first embodiment of the present invention will be described. FIG. 1 is a schematic block diagram illustrating the structure of the failure diagnosing apparatus for a semiconductor integrated circuit, according to the first embodiment of the present invention.

As shown in FIG. 1, the failure diagnosing apparatus is composed of a circuit data storage unit 101, a test vector storage unit 102, a test program storage unit 103, a switch level simulator 104, a tester 105, a DUT (device under test) 106, a simulation result storage unit 107, a test result storage unit 108, a failure diagnosing unit 109, and an output unit 110.

The circuit data storage unit 101, the test vector storage unit 102, the test program storage unit 103, and the simulation result storage unit 107 are connected to the switch level simulator 104. The circuit data indicative of the circuit structure of the DUT 106 is stored in the circuit data storage unit 101. A plurality of types of input/output signal information (to be referred to as "test vectors" hereinafter) respectively corresponding to test patterns used to test the DUT 106 are stored in the test vector storage unit 102. A test condition such as a judgement condition and a test execution speed are stored into the test program storage unit 103 in order of the test of the DUT 106.

The switch level simulator 104 simulates the operation of the DUT 106 in units of circuit wiring lines. That is, the switch level simulator 104 simulates the operation of the DUT 106 in a level of a transistor corresponding to a structural element based on the circuit data stored in the circuit data storage unit 101, the test vectors stored in the test vector storage unit 102, and the various condition stored in the test program storage unit 103. The simulating result is stored in the simulation result storage unit 107.

On the other hand, the test vector storage unit 102, the test program storage unit 103, the DUT 106, and the test result storage unit 108 are connected to the tester 105. This tester 105 tests the DUT 106 in accordance with the test vectors stored in the test vector storage unit 102, and also the test condition stored in the test program storage unit 103. The test result of the tester 105 is stored into the test result storage unit 108.

Also, the simulation result storage unit 107 and the test result storage unit 108 are connected to the failure diagnosing unit 109. This failure diagnosing unit 109 estimate the position of a failure which happens to occur in the DUT 106 based on the simulation result obtained from the switch level simulator 104, and also the test result obtained from the tester 105. The estimation result is supplied to the output unit 110 connected to the failure diagnosing unit 109, so that this output unit displays thereon the estimated failure positions.

Figure 2:
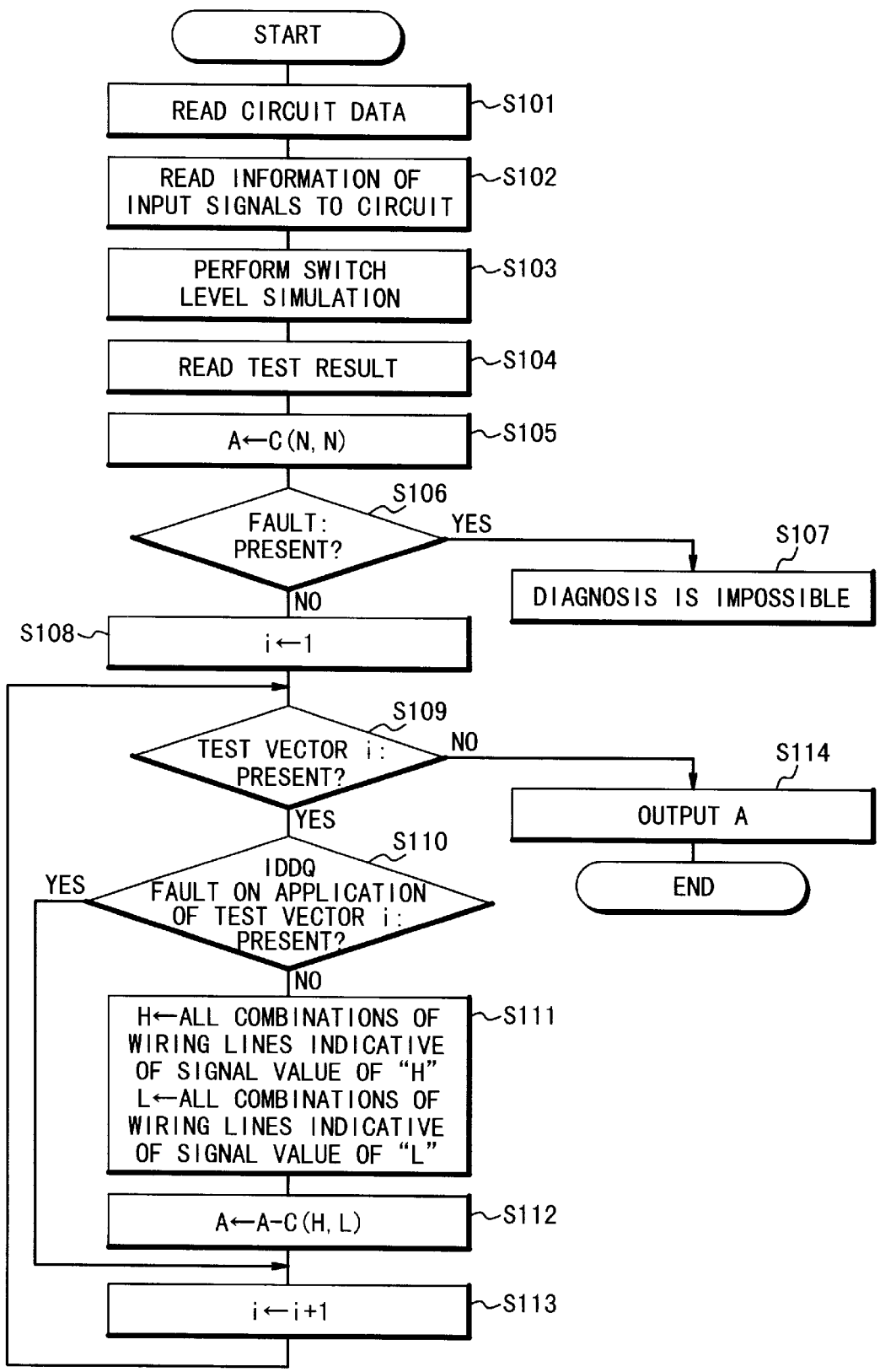
FIG. 2 is a flow chart for describing a sequential procedure of the failure diagnosing apparatus according to the first embodiment of the present invention.

The operation of the failure diagnosing apparatus for the semiconductor integrated circuit, according to this embodiment of the present invention will be described. FIG. 2 is a flow chart for describing a sequential procedure of the failure diagnosing apparatus for the semiconductor integrated circuit according to the first embodiment of the present invention.

Referring to FIG. 2, the switch level simulator 104 first reads the circuit data of the DUT 106 stored in the circuit data storage unit 101 (step S101). Then, the switch level simulator 104 reads information of input signals to the DUT 106, i.e., the test vectors stored in the test vector storage unit 102, and further the information of the test condition stored in the test program storage unit 103 (step S102). Subsequently, the switch level simulator 104 simulates the operation of the DUT 106 based on the above-explained information (step S103).

On the other hand, the tester 105 reads the test vectors from the test vector storage units 102 and the information on the test condition from the test program storage unit 103. Then, the tester 105 executes a function test and IDDQ test of the DUT 106 based upon the read out test vectors and the test condition. The tester 105 supplies the test result to the test result storage unit 108 (step S104).

Next, the failure diagnosing unit 109 reduces the number of failure candidates of a failure occurrence position in the DUT 106 based on the simulation result obtained from the switch level simulator 104 and the test result obtained from the tester 105 in accordance with the below-mentioned sequential operation. The failure diagnosing unit 109 finally estimates the failure occurrence positions, i.e., a set of failure candidates.

That is, at the first stage, the failure diagnosing unit 109 defines the set "A" of failure candidates (step S105). There is the possibility that a short circuit failure happens to occur between two of wiring lines of the semiconductor integrated circuit. Accordingly, assuming now that an entire set of wiring lines involving a power source line and the ground line is "N", the set "A" of failure candidates may be defined as follows:

$$A = C(N,N) \quad (1)$$

At this time, an operation "C" is defined as follows:

$$C(P,Q) = \{(p,q) | p \in P, q \in Q, p \neq q\} \quad (2)$$

Next, the failure diagnosing unit 109 judges whether or not a functional fault happens to occur in the DUT 106 with reference to the test result acquired from the tester 105 (step S106). When the functional fault occurs, this failure diagnosing unit 109 judges that the failure diagnosis is impossible. Therefore, the failure diagnosing unit 109 stops the failure estimating or diagnosing process (step S107). On the contrary, when the functional fault does not occur, this failure diagnosing unit 109 continues to execute the below-mentioned failure diagnosis process.

First, the failure diagnosing unit 109 sets an initial value of "1" to a pointer variable "i" indicative of the number of test vector (step S108).

Next, the failure diagnosing unit 109 judges whether or not the test vector specified by the pointer variable "i" should be processed (step S109). That is, the failure diagnosing unit 109 judges whether or not the test vector to be processed is present. In the case that the test vector specified by the pointer variable "i" is not the test vector to be processed, it can be judged that the process for all of the test vectors has been accomplished. As a result, in this case, the estimation result of the failure occurrence positions is outputted to the output unit 110 such that the estimation result is displayed (step S114). In this manner, the failure diagnosing process is completed.

On the other hand, there is the case that the test vector specified by the pointer variable "i" is the test vector to be processed. In this case, the failure diagnosing unit 109 judges whether or not an IDDQ fault happens to occur in association with this test vector based upon the test result of the tester 105 (step S110). In a case that the IDDQ fault happens to occur, the pointer variable "i" is incremented by "1", and then the control returns to the previous step S109 at which the process for the next test vector is carried out.

On the contrary, there is the case that no IDDQ fault happens to occur in association with the test vector. In this case, the failure diagnosing unit 109 refers to the simulation result by the switch level simulator 104 to acquire the wiring line data of the semiconductor integrated circuit device in association with this test vector. Then, a set "H" of wiring lines which are in the logic value of "H", and also another set "L" of wiring lines which are in the logic value of "L" are formed (step S111).

In this case, no short circuit failure occurs between the wiring line in the logic state of "H" and the wire line in the logic state of "L" when the test vector is applied without the occurrence of IDDQ fault. If any short circuit failure happens to occur, then the IDDQ fault will necessarily occur. Therefore, a combination set C (H,L) of combinations of wiring lines in which the set "H" and the set "L" are combined is removed from the set "A" of failure candidates which has been defined by the previous process to re-define the set "A" of failure candidates (step S112).

Finally, the pointer variable "i" is incremented by "1" (step S113), and then the process is returned to the step S109. Subsequently, the process defined from the step S109 to the step S113 are repeatedly performed.

Using the DUT 106 with a circuit structure shown in FIG. 3 as an example, the operation of the failure diagnosing apparatus for the semiconductor integrated circuit, according to the first embodiment, will now be described with reference to FIGS. 4 to 11B.

Figure 3:
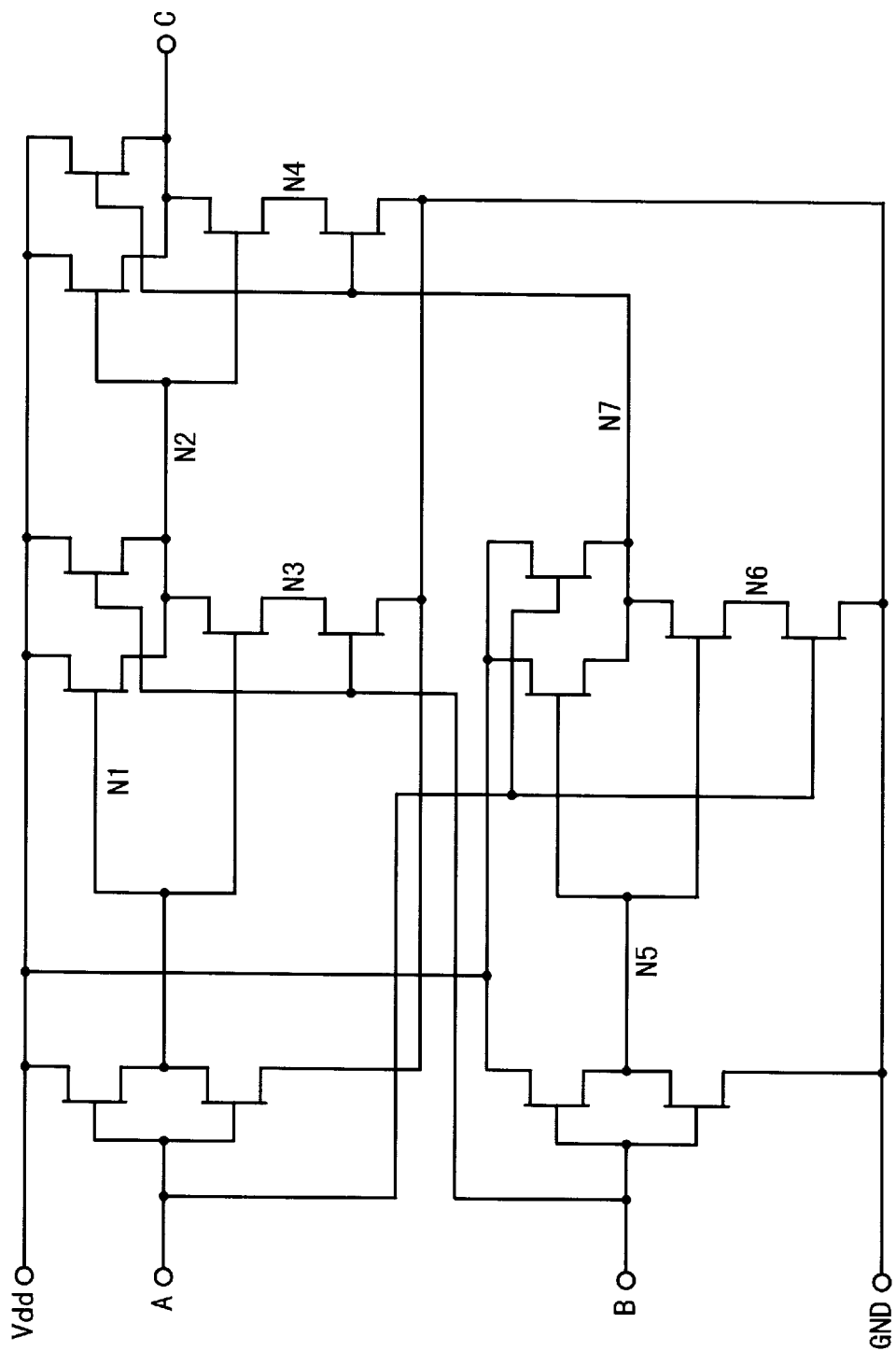
FIG. 3 is a circuit diagram for representing a structural example of a DUT (device under test) shown in FIG. 1.
Figure 4:
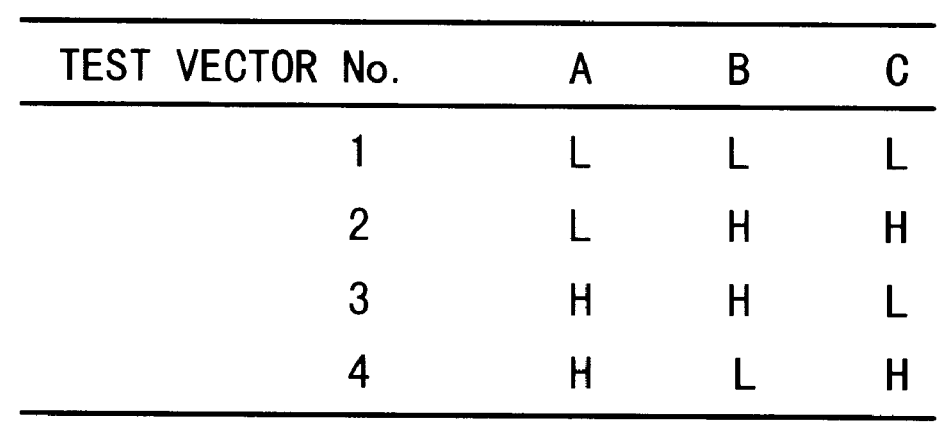
Figure 7:
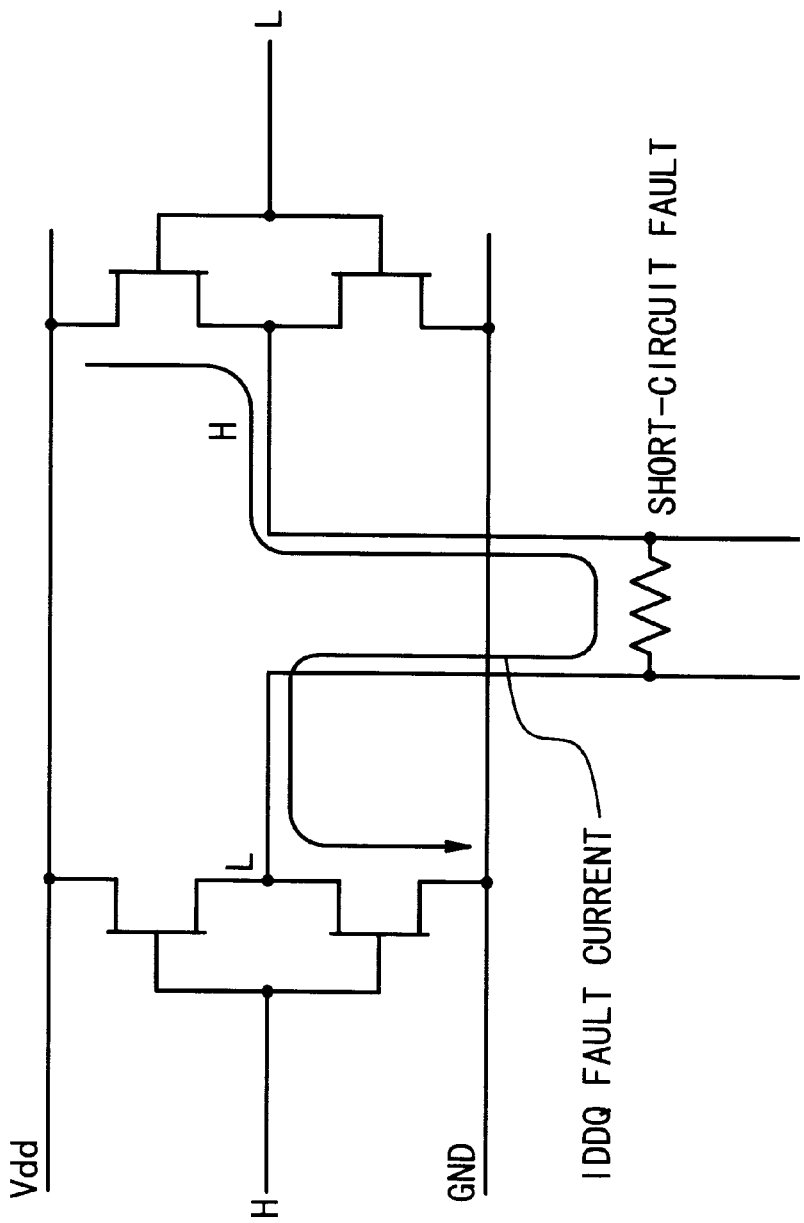
FIG. 7 is a circuit diagram for explaining a failure detecting basic idea of an IDDQ test.

FIG. 3 is a circuit diagram for representing a structural example of the DUT 106. FIG. 4 is a diagram for indicating test vectors used to test the DUT 106 shown in FIG. 3. FIG. 5 is a diagram for indicating a simulation result obtained when the test vectors shown in FIG. 4 are applied to the DUT 106 shown in FIG. 3. FIG. 6 is a diagram for representing a test result obtained when the test vectors shown in FIG. 4 are applied to the DUT 106 shown in FIG. 3. FIG. 7 is a circuit diagram for explaining a failure detecting basic idea of an IDDQ test. FIG. 8A to FIG. 11A are diagrams for representing test results obtained when the test vectors are applied to the DUT 106. FIG. 8B to FIG. 11B represent the set of failure candidates used to explain the process of the failure diagnosing apparatus for the semiconductor integrated circuit, according to the first embodiment of the present invention.

The circuit data indicative of the circuit structure shown in FIG. 3 is previously stored in the circuit data storage unit 101. The test vectors shown in FIG. 4 are previously stored in the test vector storage unit 102, and this test vectors indicate the states of signals appearing at an input terminal A, input terminal B, and output terminal C shown in FIG. 3. Also, the simulation result indicated in FIG. 5 is stored in the simulation result storage unit 107, and the test result shown in FIG. 6 is stored into the test result storage unit 108.

The following description is made based on an assumption that a short circuit failure with a high resistive characteristic happens to occur between a wiring line N2 and a wiring line N3 in the DUT 106 shown in FIG. 3. There is the case that the short circuit failure with the high resistive characteristic happens to occur between the wiring line N2 and the wiring line N3. In this case, the test result of the IDDQ test by the tester 105 is judged to be "FAIL" in association with the test vector 3, as indicated in FIG. 6. This is because an IDDQ fault current flow, so that the power source quiescent current increases due to the short circuit failure, as shown in FIG. 7. However, since this failure is the short circuit failure with the high resistive characteristic, no adverse influence is given to the logic operation (function test). As a result, as indicated in FIG. 6, the function test is judged to be "PASS" in association with the test vector 3.

On the other hand, a set N of all the wiring lines of the DUT 106 shown in FIG. 3, involving the input/output terminals, the power supply line Vdd, and the ground line GND, are defined as follows:

$$N=\{A, B, C, N1, N2, N3, N4, N5, N6, N7, Vdd, GND\} \quad (3)$$

As a consequence, the set "A" of failure candidates defined for the DUT 106 by the failure diagnosing unit 109 at the process of the step S105 is given as:

$$A=\{(A,B), (A,C), (A,N1), (A,N2), (A,N3), (A,N4), (A,N5),$$
$$(A,N6), (A,N7), (A,Vdd), (A,GND),$$

$$(B,C), (B,N1), (B,N2), (B,N3), (B,N4), (B,N5), (B,N6), (B,N7),$$
$$(B,Vdd), (B,GND), (C,N1), (C,N2),$$

$$(C,N3), (C,N4), (C,N5), (C,N6), (C,N7), (C,Vdd), (C,GND), (N1,$$
$$N2), (N1,N3), (N1,N4), (N1,N5),$$

$$(N1,N6), (N1,N7), (N1,Vdd), (N1,GND), (N2,N3), (N2,N4), (N2,$$
$$N5), (N2,N6), (N2,N7), (N2,Vdd),$$

$$(N2,GND), (N3,N4), (N3,N5), (N3,N6), (N3,N7), (N3,Vdd), (N3,$$
$$GND), (N4,N5), (N4,N6), (N4,N7),$$

$$(N4,Vdd), (N4,GND), (N5,N6), (N5,N7), (N5,Vdd), (N5,GND),$$
$$(N6,N7), (N6,Vdd), (N6,GND), (N7,Vdd), (N7,GND), (Vdd,$$
$$GND)\} \quad (4)$$

Figures 8A, 8B:
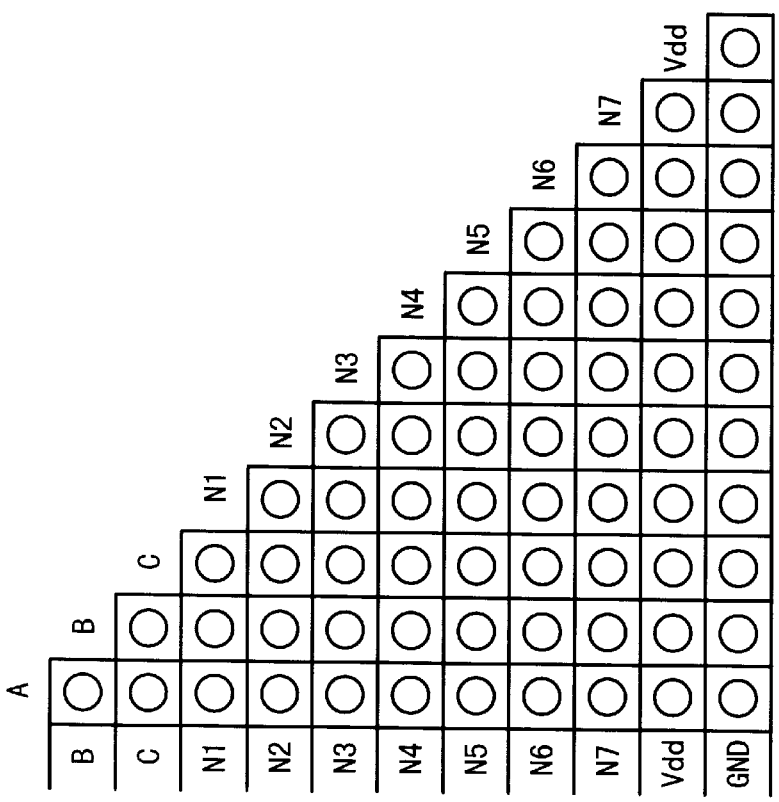
FIG. 8A is a diagram for representing a test result obtained when the test vectors are applied to the DUT and FIG. 8B is a diagram for representing a set of failure candidates used to explain the process of the failure diagnosing apparatus according to the first embodiment of the present invention.

FIG. 8A is a diagram for representing a test result obtained when the test vectors are applied to the DUT. FIG. 8B illustratively shows the content of this set "A" of failure candidates. A symbol "○" indicates a combination of wiring lines between which an occurrence of a short circuit failure is suspected. On the other hand, a symbol "X" denotes a combination of wiring lines between which an occurrence of a short circuit failure is not suspected. It should be understood that the processing for reducing the number of failure candidates is not yet executed in the process which has been executed heretofore. Therefore, all of the combinations of wiring lines are listed up as the failure candidates in which the occurrences of the short circuit failures would be suspected.

Next, the failure diagnosing unit 109 judges whether or not a "functional fault" happens to occur in the DUT 106, based on the test result of the tester 105 (step S106). As represented in FIG. 6, since the functional fault does not occur in the DUT 106 shown in FIG. 3, the failure diagnosis can be done in this DUT 106.

Subsequently, the failure diagnosing unit 109 sets the initial value of "1" to the pointer variable "i" in the process of the step S107. When this failure diagnosing unit 109 confirms that the test vector 1 is the test vector to be processed (step S109), the failure diagnosing unit 109 reduces the number of failure candidates based on the simulation result and the test result in association with the test vector 1. In this case, as indicated in FIG. 6, no IDDQ fault occurs in association with the test vector 1 (step S110). The failure diagnosing unit 109 acquires the wiring line information associated with the test vector 1. Thus, both a set "H" of wiring lines which are in the logical state of "H" and another set "L" of wiring lines which are in the logical state of "L" are determined based upon the simulation result of the switch level simulation 104 (step S111) as follows.

$$H=\{N1, N2, N3, N5, N6, N7, Vdd\}$$

$$L=\{A, B, C, N4, GND\} \quad (5)$$

Figures 9A, 9B:
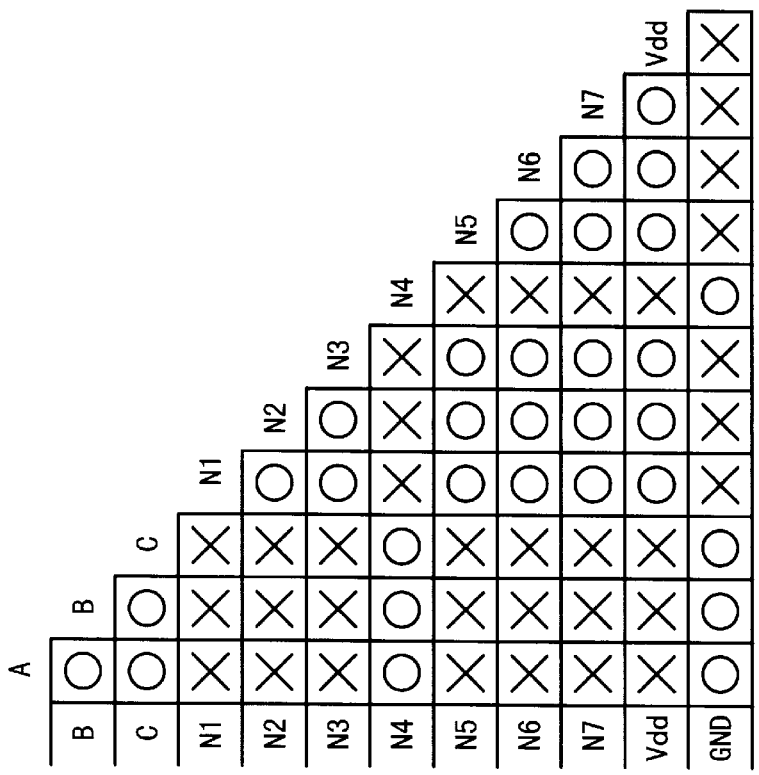
FIG. 9A is a diagram for representing a test result obtained when the test vectors are applied to the DUT and FIG. 9B is a diagram for representing the set of failure candidates used to explain the process of the failure diagnosing apparatus according to the first embodiment of the present invention.

Next, the set C(H,L) is calculated from each of elements of the set "H" and each of elements of the set "L". The calculated set C(H,L) is removed from the set "A" of failure candidates which has been defined in the preceding process, and then the set "A" of failure candidates is again defined (step S112). At this time, the set "A" of failure candidates is illustrated in FIG. 9B. FIG. 9B is a diagram for indicating a processing result in association with the test vector 1. In FIG. 9B, the symbol "X" is applied to combinations of the wiring lines between which the occurrence of any failure is not suspected in association with the set "A" of failure candidates shown in FIG. 8B. FIG. 9A is a diagram for representing a test result obtained when the test vectors are applied to the DUT 106.

Next, the pointer variable "i" is incremented by "1" (step S113), and then the process is returned to the previous step S109 at which the process in association with the test vector 2 is carried out. As indicated in FIG. 6, since no IDDQ fault happens to occur in association with the test vector 2 (step S110), the set "H" and the set "L" are set in the same manner as in the test vector 1 (step S111) to calculate the set C(H,L). The calculated set C(H,L) is removed from the set "A" of failure candidates and then the set "A" of failure candidates is again defined. Thus, the number of failure candidates is reduced.

At this time, the set "A" of failure candidates is illustrated in FIG. 10B. FIG. 10B is a diagram for indicating a process result in association with the test vector 2. In FIG. 10B, the symbol "X" is applied to a combination of the wiring lines between which the occurrence of any failure is not suspected in association with the set "A" of failure candidates shown in FIG. 9B. FIG. 10A is a diagram for representing a test result obtained when the test vectors are applied to the DUT 106.

Next, the pointer variable "i" is incremented by "1" (step S113), and then the process is returned to the previous step S109 at which the process in association with the test vector 3 is carried out. As indicated in FIG. 6, since a IDDQ fault happens to occur in association with the test vector 3 (step S110), the pointer variable "i" is incremented by "1" without redefining the set "A" of failure candidates (step S113). Then, the process is returned to the step S109 at which the process for the test vector 4 is carried out.

Figures 11A, 11B:
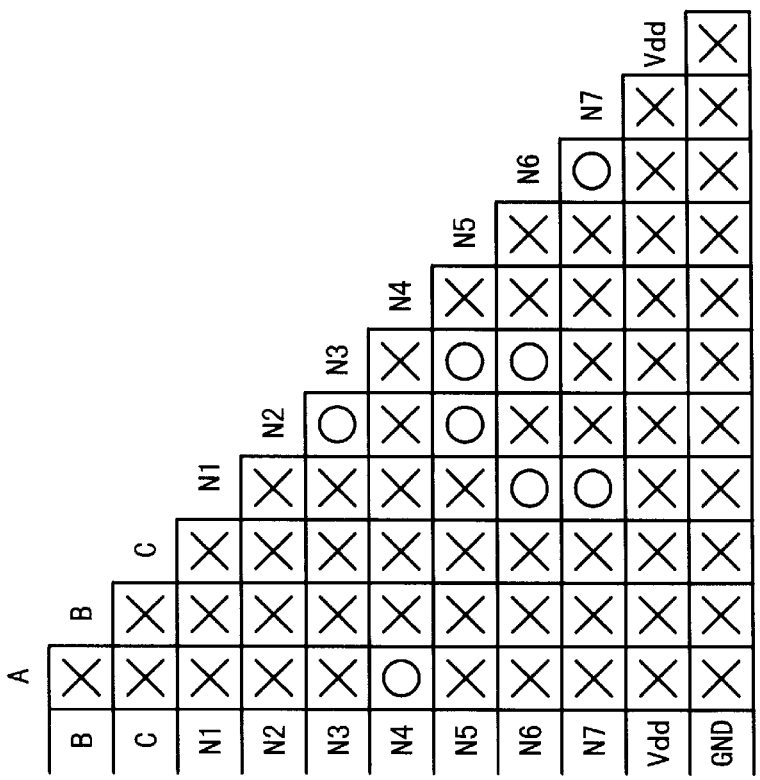
FIG. 11A is a diagram for representing a test result obtained when the test vectors are applied to the DUT and FIG. 11B is a diagram for representing the set of failure candidates used to explain the process of the failure diagnosing apparatus according to the first embodiment of the present invention.

As represented in FIG. 6, since no IDDQ fault happens to occur in association with the test vector 4 (step S110), the set "H" and the set "L" are set so as to calculate the set C(H,L) in the same manner as in the test vector 1 and the test vector 2. The calculated set C(H,L) is removed from the set "A" of failure candidates and then the set "A" of failure candidates is again defined. At this time, the set "A" of failure candidates is illustrated in FIG. 11B. FIG. 11B is a diagram for indicating a process result associated with the test vector 3. In FIG. 11B, the symbol "X" is applied to a combination of the wiring lines between which the occurrence of any failure is not suspected in association with the set "A" of failure candidates shown in FIG. 10B. FIG. 11A is a diagram for representing a test result obtained when the test vectors are applied to the DUT 106.

Next, the pointer variable "i" is incremented by "1" (step S113), and then the process is returned to the previous step S109 at which the process with respect to the test vector 5 is carried out. However, since there is no test vector 5, the process is advanced to the step S114 at which the set "A" of failure candidates is outputted to the output unit 110 such that the processing result is displayed. Thereafter, the process is ended.

Since the above-described process is carried out, the failure diagnosing unit 109 outputs as a final set "A" of failure candidates (see FIG. 11A and 11B):

$$A=\{(A,N4), (N1,N6), (N1,N7), (N2,N3), (N2,N5), (N3,N5), (N3,N6), (N6,N7)\} \quad (6)$$

The failure occurrence position (N2,N3) in which the short circuit failure is firstly assumed is involved in this final set "A" of failure candidates. As a consequence, this may identify the effectiveness of the failure diagnosing apparatus for the semiconductor integrated circuit, according to the first embodiment.

Usually, since the DUT 106 is sealed in a package, this package must be opened in order to confirm a failure occurrence position. However, in accordance with this first embodiment, while employing the simulation result by the switch level simulator 104 and the test result by the tester 105, the failure occurrence positions can be estimated only by way of the process by the computer. As a result, the failure occurrence positions can be estimated without opening the package of the DUT 106, and the failure diagnosis can be carried out within a short time period.

Next, the failure diagnosing apparatus according to the second embodiment of the present invention will be described. In the failure diagnosing apparatus for the semiconductor integrated circuit, according to this second embodiment, the structure of this failure diagnosing apparatus according to the second embodiment is similar to that of the first embodiment. The process executed by the failure diagnosing unit 109 thereof is different from that of the first embodiment. Therefore, the detailed explanation of the units other than the failure diagnosing unit 109 is omitted by allocating the same reference numerals to them.

The failure diagnosing unit 109 of this second embodiment executes the process for reducing the number of failure candidates by using the simulation result by the switch level simulation not only in a case that no IDDQ fault happens to occur, but also in a case that an IDDQ fault happens to occur.

Referring now to drawings, operation of the failure diagnosing apparatus for the semiconductor integrated circuit, according to the second embodiment, will be described.

Figure 12:
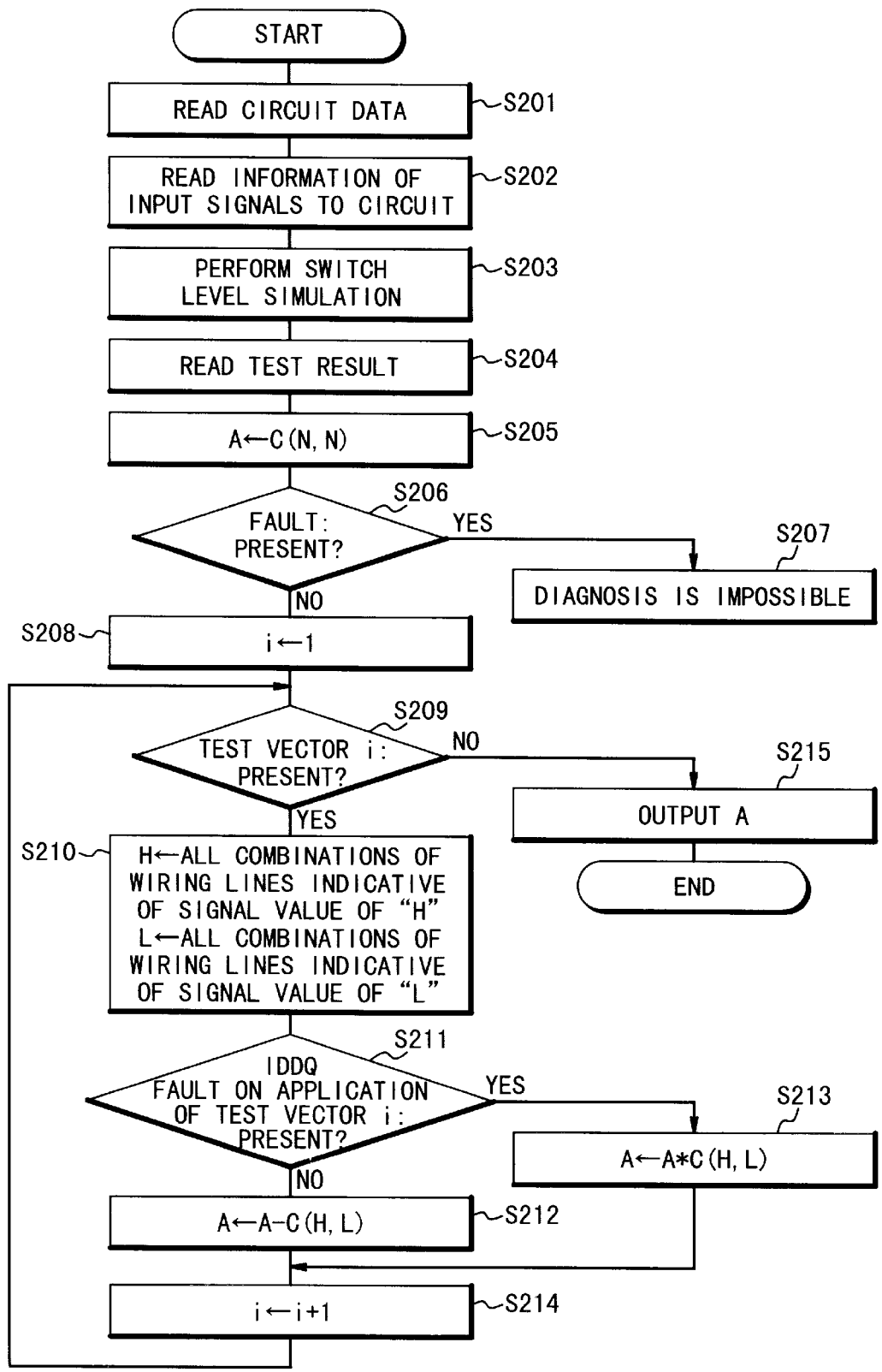
FIG. 12 is a flow chart for describing a sequential operation of the failure diagnosing apparatus according to the second embodiment of the present invention.

FIG. 12 is a flow chart for describing a sequential operation of the failure diagnosing apparatus for the semiconductor integrated circuit, according to the second embodiment of the present invention. It should be noted that the processes defined from a step S201 to a step S209 shown in FIG. 12 are similar to those defined from the step S101 to the step S109 in the first embodiment. Therefore, the explanation thereof is omitted.

In FIG. 12, when it is judged at the step S209 that a test vector specified by a pointer variable "i" is the test vector to be processed, the following processing is carried out. That is, the failure diagnosing unit 109 firstly acquires wiring line information associated with this test vector based on the simulation result by the switch level simulator 104. Then, this failure diagnosing unit 109 produces the set "H" of wiring lines which are in the logical state "H", and also another set "L" of wiring lines which are in the logical state "L", respectively (step S210).

Next, detection is made as to whether or not an IDDQ fault happens to occur in association with the test vector specified by the pointer variable "i" (step S211). In a case that any IDDQ fault does not occur, there is no short circuit failure in the wiring lines contained in the set C(H,L.) Therefore, this set C(H,L) is removed from the set "A" of failure candidates which has been defined in the preceding process, and then the set "A" of failure candidates is again defined (step S212).

On the other hand, when a IDDQ fault happens to occur, if this IDDQ fault is a single fault, then the wiring lines associated with the IDDQ fault are necessarily contained in the set C(H,L). As a consequence, the failure diagnosing unit 109 calculates a product of the set "A" of failure candidates and the set C(H,L) of failure candidates (combinations of wiring lines) and then the set "A" of failure candidates is again defined (step S213).

Finally, the pointer variable "i" is incremented by "1" (step S214), and then the process is returned to the step S209 at which the process defined from the step S209 to the step S215 are repeatedly carried out.

Similar to the first embodiment, while employing the DUT 106 shown in FIG. 3 as an example, the operation of the failure diagnosing apparatus for the semiconductor integrated circuit, according to this second embodiment, will now be described with reference to FIG. 13A and FIG. 14B. It should be noted that the processes associated with the test vector 1 and the test vector 2 are similar to those of the first embodiment.

As represented in FIG. 6, an IDDQ fault happens to occur in association with the test vector 3. Therefore, in the case that the failure is a single failure, a failure occurrence position is involved in the set C(H,L). In other words, assuming now that:

$$H=\{A, B, N2, N7, Vdd\}$$

$$L=\{C, N1, N3, N4, N5, N6, GND\} \quad (7)$$

a combination of failure wiring lines is involved in the set C(H,L) expressed as follows:

$$C(H,L)=\{(A,C), (A,N1), (A,N3), (A,N4), (A,N5), (A,N6),\\ (A,GND), (B,N1), (B,N3), (B,N4), (B,N5), (B,N6), (B,GND),\\ (N2,N3), (N2,N4), (N2,N5), (N2,N6), (N2,GND), (N7,N4),\\ (N7,N5), (N7,N6), (N7,GND), (Vdd,N5), (Vdd,N6), (Vdd,\\ GND)\} \quad (8)$$

Figures 13A, 13B:
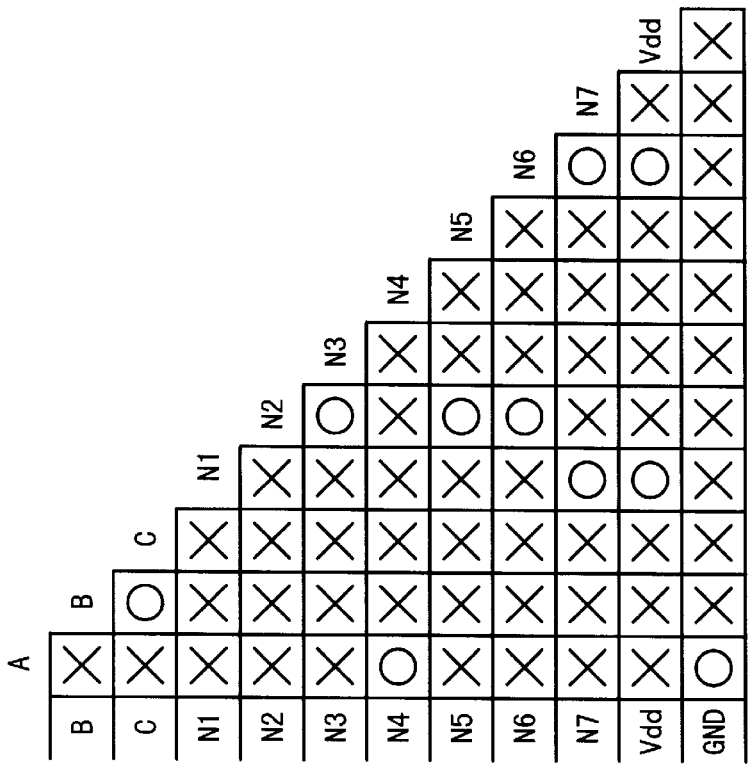
FIG. 13A is a diagram for representing a test result obtained when the test vectors are applied to the DUT and FIG. 13B is a diagram for representing the set of failure candidates used to explain the process of the failure diagnosing apparatus according to the second embodiment of the present invention.

As a result, a product of the set "A" of failure candidates and the set C(H,L), which has been defined in the preceding process, is calculated, so that the set "A" of failure candidates may be again defined as shown in FIG. 13B;

$$A=\{(A,N4), (A,GND), (B, C), (N1,N7), (N1,Vdd), (N2,N3), (N2,\\ N5), (N2,N6), (N6,N7), (N6,Vdd)\} \quad (9)$$

FIG. 13A is a diagram for representing a test result obtained when the test vectors are applied to the DUT 106. FIG. 13B is a diagram for representing a process result in association with the test vector 3 in accordance with this second embodiment. In FIG. 13B, the symbol "X" is applied to combinations of the wiring lines between which the occurrence of any failure is not suspected in association with the set "A" of failure candidates shown in FIG. 10B of the first embodiment.

Figures 14A, 14B:
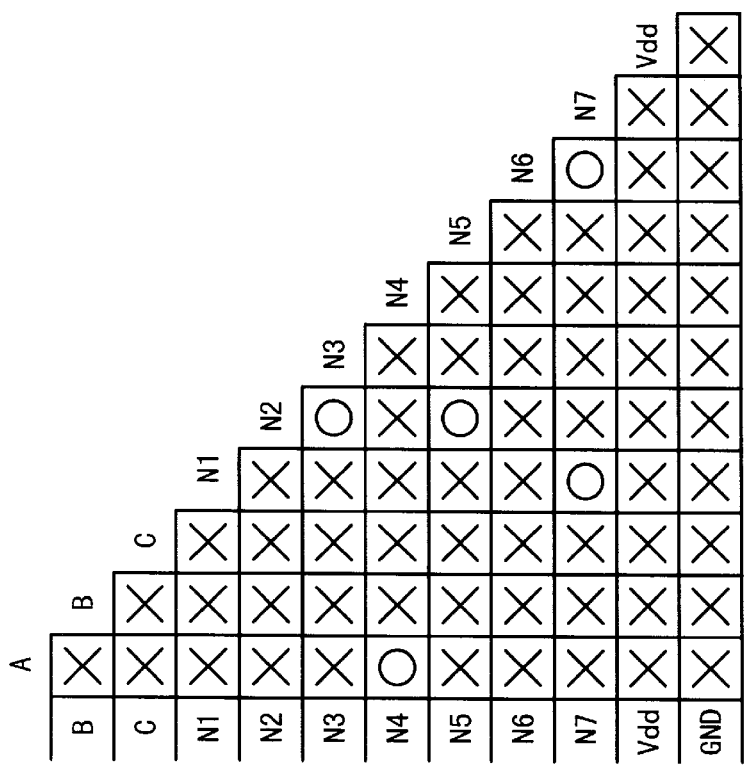
FIG. 14A is a diagram for representing a test result obtained when the test vectors are applied to the DUT and FIG. 14B is a diagram for representing the set of failure candidates used to explain the process of the failure diagnosing apparatus according to the second embodiment of the present invention.

Subsequently, when the process for the test vector 4 is carried out in the same manner as in the first embodiment, the set "A" of failure candidates is finally given as indicated in FIG. 14B. That is, $$A=\{(A,N4), (N1,N7), (N2,N3), (N2,N5), (N6,N7)\} \quad (10)$$

FIG. 14A is a diagram for representing a test result obtained when the test vectors are applied to the DUT 106. As a consequence, the number of failure candidates can be finally reduced.

It should also be noted that FIG. 14B is a diagram for representing a process result in association with the test vector 4. In FIG. 14B, the symbol "X" is applied to combinations of the wiring lines between which the occurrences of the failures are not suspected in the set "A" of failure candidates shown in FIG. 13B.

As a result, in accordance with this second embodiment, the failure diagnosis is carried out by utilizing not only the simulation data acquired when the IDDQ fault is not detected, but also the simulation data acquired when the IDDQ fault is detected. Therefore, when the failure occurred in the DUT is a single failure, the number of failure candidates can be further reduced. Thus, the failure occurrence positions can be more correctly estimated.

Next, the failure diagnosing apparatus according to the third embodiment of the present invention will now be explained with reference to drawings.

FIG. 15 is a schematic block diagram for representing the structure of a failure diagnosing apparatus for an semiconductor integrated circuit, according to the third embodiment of the present invention.

In FIG. 15, the failure diagnosing apparatus for the semiconductor integrated circuit, according to this third embodiment, further includes a layout data storage unit 111 in which layout data indicative of a layout of circuit wiring lines of the DUT 106 is stored. The other structure of the failure diagnosing apparatus in the third embodiment is the same as that of the first embodiment. Therefore, the explanation on the units of the failure diagnosing apparatus other than the layout data storage unit 111 and the failure diagnosing unit 109 is omitted by allocating the same reference numerals as those of the first embodiment to them. In the failure diagnosing apparatus in the third embodiment, a failure diagnosing unit 109 can reduce the number of failure candidates of failure occurrence positions in the DUT 106 based on the layout data stored in the layout data storage unit 111.

Referring now to drawings, a description will be made of operation of the failure diagnosing apparatus for the semiconductor integrated circuit, according to third embodiment.

Figure 16:
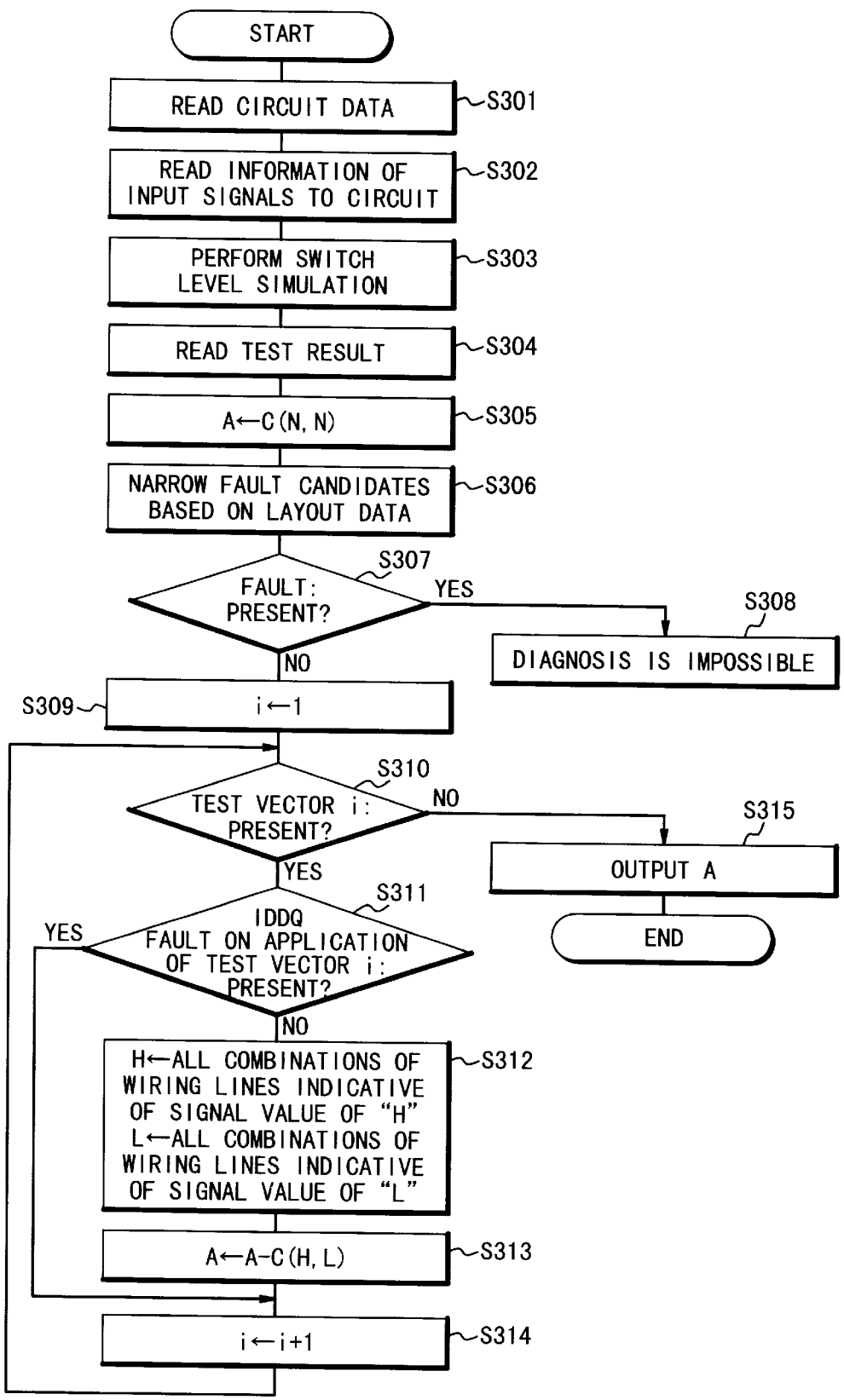
FIG. 16 is a flow chart for describing a sequential operation of the failure diagnosing apparatus according to the third embodiment of the present invention.

FIG. 16 is a flow chart for describing a sequential operation of the failure diagnosing apparatus for the semiconductor integrated circuit, according to the third embodiment of the present invention. It should be noted that the processes defined from a step S301 to a step S305 of FIG. 16 are the same as those defined from the step S101 to the step S105 in the first embodiment. Therefore, the explanation is omitted.

When the processes defined from the step S301 to the step S305 are accomplished, the failure diagnosing unit 109 firstly removes combinations of wiring lines which are arranged to be close to each other, and combinations of wiring lines which intersect to each other, from the initial set C(N,N) of the set "A" of failure candidates based on the layout data stored in the layout data storage unit 111. Thus, the set "A" of failure candidates is defined again (step S306)

It should also be noted that since the subsequent processes defined from a step S307 to a step S315 are the same as those defined from the step S106 to the step S114 in the first embodiment, the description thereof is omitted.

Using the DUT 106 shown in FIG. 3 which is used in the first embodiment as an example, the operation of the failure diagnosing apparatus for the semiconductor integrated circuit, according to the third embodiment, will now be described with reference to FIG. 17 to FIG. 21B.

Figure 17:
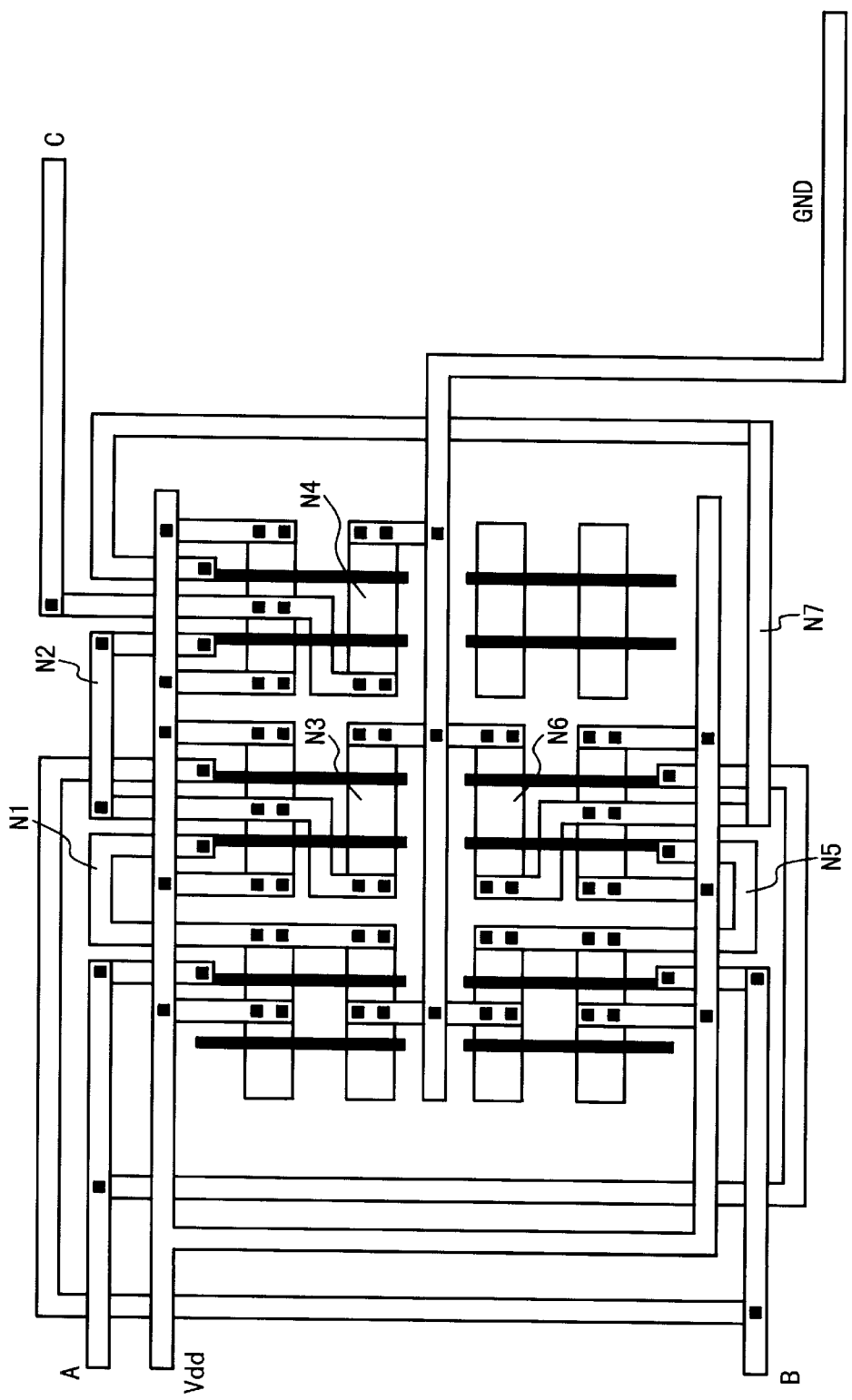
FIG. 17 is a plan view for showing a wiring line layout of the circuit diagram shown in FIG. 3.

FIG. 17 is a plan view for showing a wiring line layout of the circuit diagram indicated in FIG. 3. FIG. 18 to FIG. 21B are diagrams for representing the set of failure candidates set used to explain the processes of the failure diagnosing apparatus for the semiconductor integrated circuit, according to the third embodiment of the present invention.

If the layout of the DUT 106 shown in FIG. 3 is as indicated in FIG. 17, then the set "A" of failure candidates redefined in the process of the step S306 is illustrated in FIG. 18. In FIG. 18, the symbol "○" is applied as the failure candidate to either the combination of the adjoining (close) wiring lines or the combination of the intersected wiring lines. On the other hand, the symbol "X" is applied to the combinations of other wiring lines, because the occurrence of any short circuit failure is not suspected in the combinations.

Figures 19A, 19B:
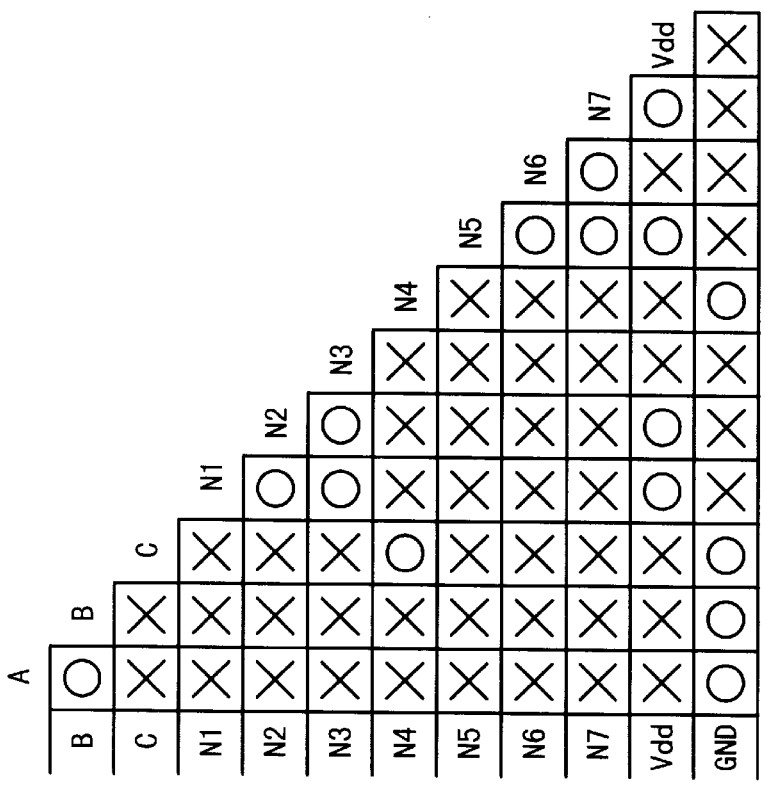
FIG. 19A is a diagram for representing a test result obtained when the test vectors are applied to the DUT and FIG. 19B is a diagram for representing the set of failure candidates set used to explain the processes of the failure diagnosing apparatus according to the third embodiment of the present invention.
Figures 20A, 20B:
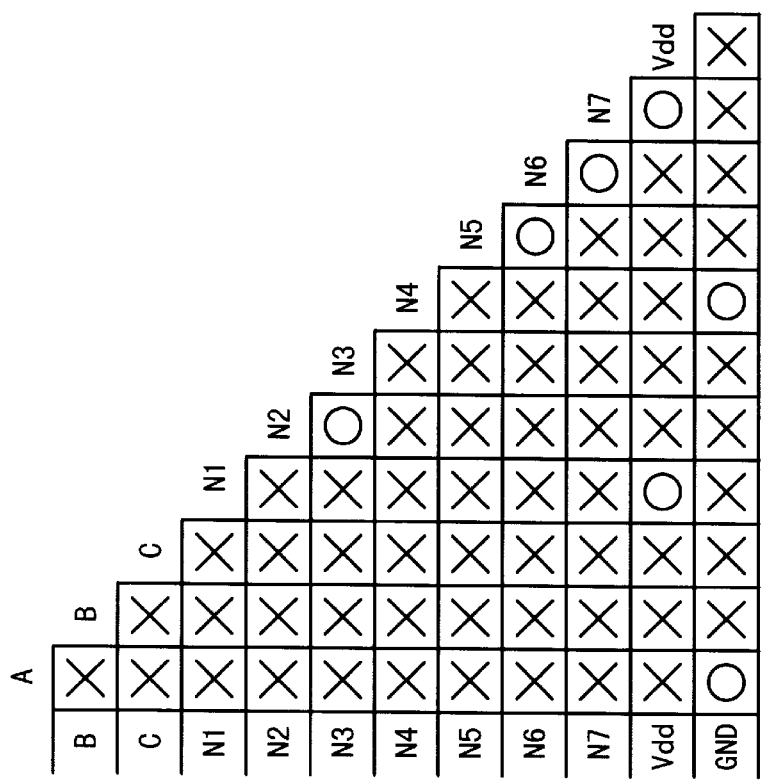
FIG. 20A is a diagram for representing a test result obtained when the test vectors are applied to the DUT and FIG. 20B is a diagram for representing the set of failure candidates set used to explain the processes of the failure diagnosing apparatus according to the third embodiment of the present invention.
Figures 21A, 21B:
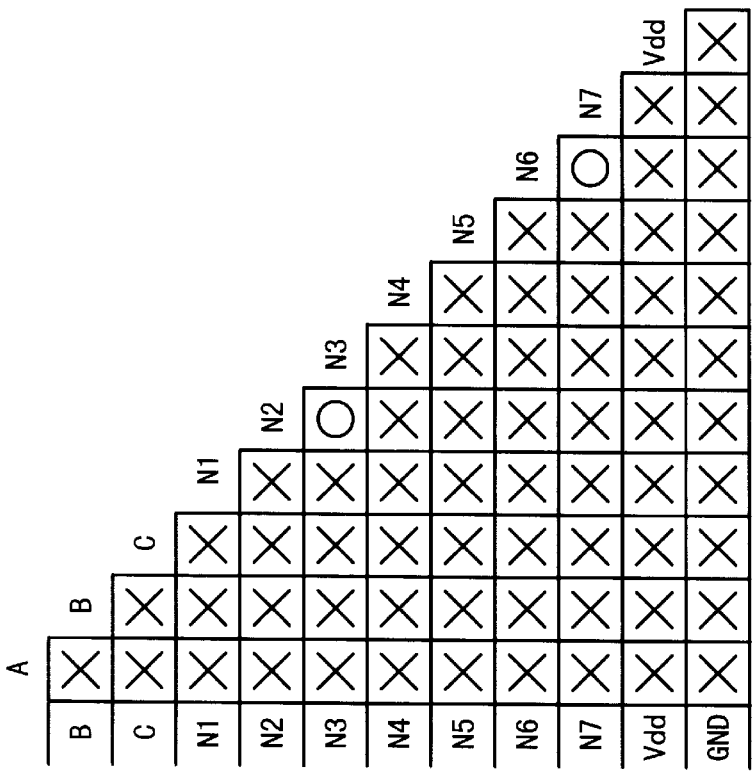
FIG. 21A is a diagram for representing a test result obtained when the test vectors are applied to the DUT and FIG. 21B is a diagram for representing the set of failure candidates set used to explain the processes of the failure diagnosing apparatus according to the third embodiment of the present invention.

The subsequent processes after the step S306 are carried out in the same manner as those of the first embodiment. There is the case where the occurrence of any short circuit failure is not suspected in the combination as a result of the processes associated with the test vector 1. In such a case, the symbol "X" is allocated to each of the combinations of the wiring lines of the set "A" of failure candidates shown in FIG. 18. FIG. 19A is a diagram for representing a test result obtained when the test vectors are applied to the DUT 106. FIG. 19B shows the set "A" of failure candidates to which the symbols "X" are allocated. Also, FIG. 20A is a diagram for representing a test result obtained when the test vectors are applied to the DUT 106. FIG. 20B shows the set "A" of failure candidates. In FIG. 20, the symbol "X" is allocated to each of the combinations of the wiring lines of the set "A" of failure candidates shown in FIG. 19B, when the occurrence of any short circuit failure is not suspected in each of the combinations as a result of the processes associated with the test vector 2. Furthermore, FIG. 21A is a diagram for representing a test result obtained when the test vectors are applied to the DUT 106. FIG. 21B shows the set "A" of failure candidates. In FIG. 21B, the symbol "X" is allocated to each of the combinations of the wiring lines of the set "A" of failure candidates shown in FIG. 20B, when the occurrence of any short circuit failure is not suspected in the combination as a result of the processes associated with the test vector 4. As a consequence, as represented in FIGS. 21A and 21B, the number of failure candidates is finally reduced to two in this third embodiment.

In this manner, in accordance with this third embodiment, the combinations of the adjoining wiring lines, or the combinations of the intersected wiring lines are previously used as the failure candidates by using the layout data of the DUT 106 stored in the layout data storage unit 111. Therefore, the combinations of the wiring lines which can not be considered as the failure candidates are removed in the stage of provision of the set "A" of failure candidates, so that the failure occurrence position can be more precisely estimated.

It should be understood that although the process defined in the step S307 and the subsequent processes are carried out in the same manner as these of the first embodiment, these processes may be performed in the same manner as those of the second embodiment.

Next, the failure diagnosing apparatus according to the fourth embodiment of the present invention will now be explained with reference to drawings.

Figure 22:
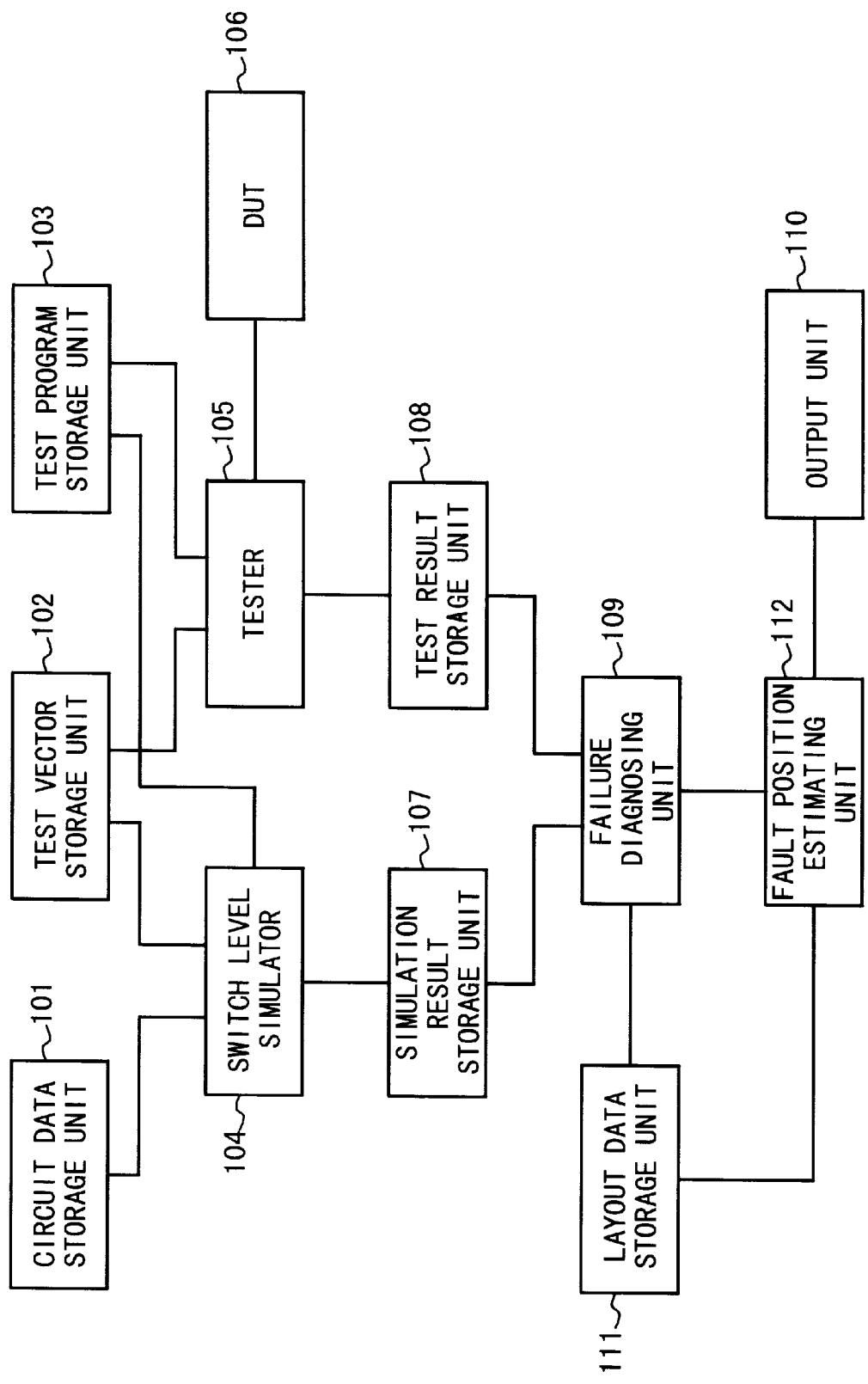
FIG. 22 is a schematic block diagram for representing the structure of a failure diagnosing apparatus according to a fourth embodiment of the present invention.

FIG. 22 is a schematic block diagram for representing the structure of a failure diagnosing apparatus for an semiconductor integrated circuit, according to the fourth embodiment of the present invention.

In FIG. 22, the structure of the failure diagnosing apparatus for the semiconductor integrated circuit, according to this fourth embodiment is similar to that of the third embodiment. The different point between the third embodiment and the fourth embodiment is in that the failure diagnosing apparatus in the fourth embodiment further includes a failure position estimating unit 112, which is connected to the layout data storage unit 111, the failure diagnosing unit 109 and the output unit 110. Thus, the failure diagnosing unit 109 is connected to the output unit 110 through the fault position estimating unit 112. The fault position estimating unit 112 designates a physical position where a fault happens to occur, based upon the layout data stored in the layout data storage unit 111. Since other components of this fourth embodiment are the same as these of the third embodiment, the explanation thereof is omitted by allocating the same reference numerals as those of the first embodiment to them.

Referring now to drawings, a description will be made of the operation of the failure diagnosing apparatus for the semiconductor integrated circuit, according to the fourth embodiment.

Figure 23:
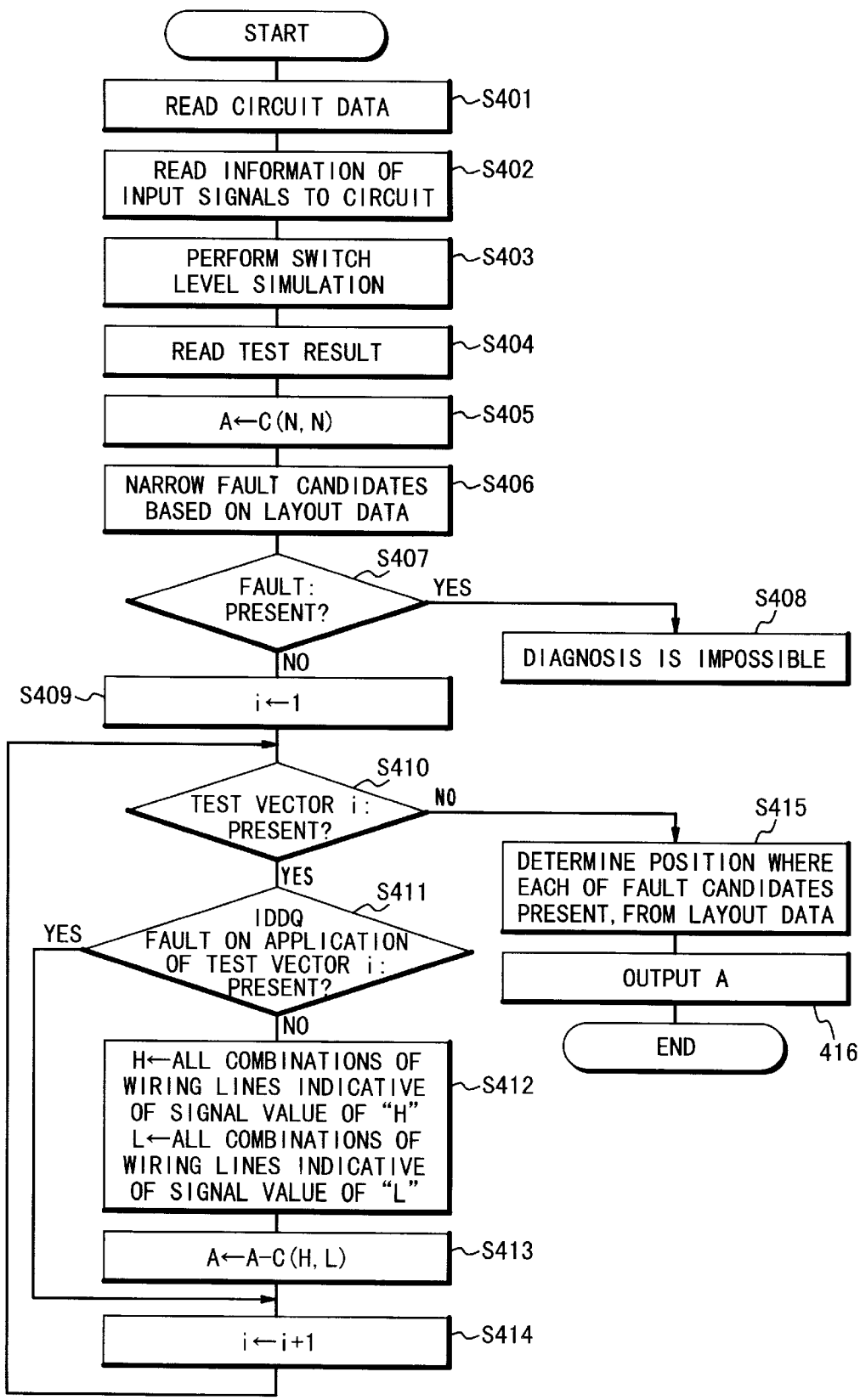
FIG. 23 is a flow chart for describing a sequential operation of the failure diagnosing apparatus according to the fourth embodiment of the present invention.

FIG. 23 is a flow chart for describing a sequential operation of the failure diagnosing apparatus for the semiconductor integrated circuit, according to the fourth embodiment of the present invention. It should be noted that the processes defined from a step S401 to a step S410 of FIG. 23 are the same as those defined from the step S301 to the step S310 of the third embodiment. Therefore, the explanation thereof is omitted.

In FIG. 23, it is judged that the processes associated with all of the test vectors are accomplished by repeatedly executing the process by the failure diagnosing unit 109 defined at the step S410. At that time, the fault position estimating unit 112 designates the physical positions of the failure candidates from the layout data of the DUT 106 stored in the layout data storage unit (step S415). In other words, the fault position estimating unit 112 determines the physical positions of the failure candidates of the set "A" for the DUT 106 which are finally left based on the layout data. Then, the fault position estimating unit 112 outputs the acquired physical positions in the form of pairs of the failure candidate and the failure position.

It should also be noted that the subsequent processes defined from a step S411 to a step S414 are the same as those defined from the step S311 to the step S314 of the third embodiment, the description thereof is omitted.

Next, using the DUT 106 shown in FIG. 3 as an example in the same manner as in the first embodiment, the operation of the failure diagnosing apparatus for the semiconductor integrated circuit, according to the fourth embodiment, will now be described with reference to FIG. 24. The layout data of the DUT 106 is as indicated in FIG. 17.

Figure 24:
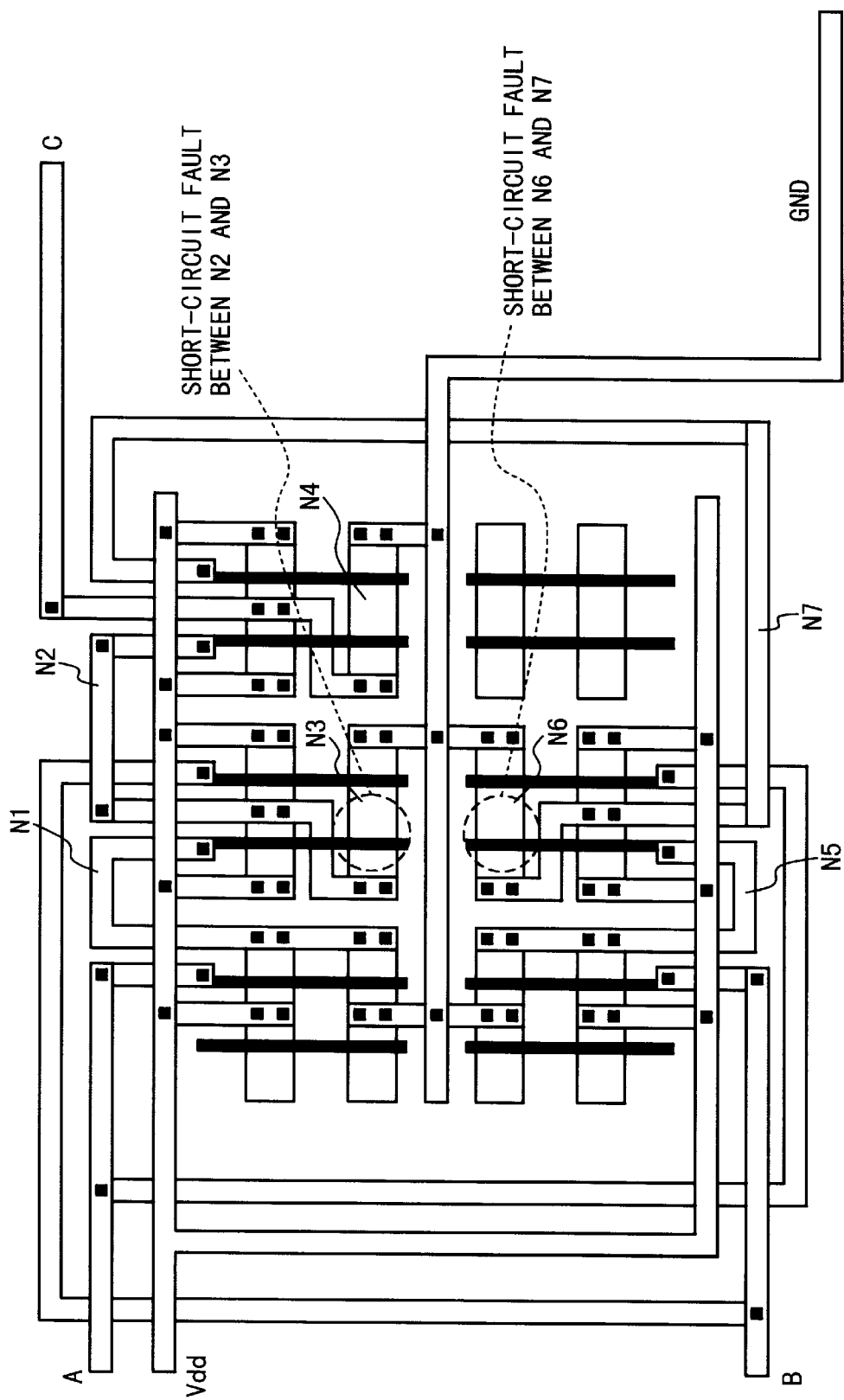
FIG. 24 is a plan view for showing a wiring line layout of the circuit diagram shown in FIG. 3.

FIG. 24 is a plan view for showing a wiring line layout of the circuit diagram indicated in FIG. 3.

As indicated in the third embodiment, the final failure candidates are a combination of a wiring line N2 and a wiring line N3, and another combination of a wiring line N6 and a wiring line N7. The failure occurrence position estimating unit 112 specifies positions of the respective wiring lines based upon the layout data of the DUT 106 shown in FIG. 17. Then, the failure occurrence position estimating unit 112 acquires a close point or intersecting point between the wiring line N2 and the wiring line N3, and also acquires a close point or intersecting point between the wiring line N6 and the wiring line N7. At that time, these relevant positions are as illustrated in FIG. 24.

Next, the fault position estimating unit 112 designates these positions as failure occurrence positions (step S415). As a result, the output unit 110 displays "short circuit failure between wiring line N2 and wiring line N3", and "short circuit failure between wiring line N6 and wiring line N7". Also, the output unit 110 displays the physical positions of the failure positions determined by the fault position estimating unit 112 together with the above messages, as represented in FIG. 24 (step S416).

As a consequence, in accordance with this fourth embodiment, since the physical positions of the failure occurrence positions are displayed by using the layout data of the DUT 106, the precise failure analysis can be carried out with a short time by various analyzing apparatus.

Referring now to drawings, the failure diagnosing apparatus according to the fifth embodiment of the present invention will be explained.

In the failure diagnosing apparatus for the semiconductor integrated circuit, according to this fifth embodiment, the process executed by a failure diagnosing unit 109 thereof is different from that of the first embodiment. The structure of this failure diagnosing apparatus according to the fifth embodiment is the same as that of the first embodiment. Therefore, the detailed explanation of the structure of this failure diagnosing apparatus is omitted by allocating the same reference numerals as those of the first embodiment to the units of the failure diagnosing apparatus in the fifth embodiment.

The failure diagnosing unit 109 of this fifth embodiment can sequentially designate failure occurrence positions of the DUT 106 in the order of higher failure occurrence possibilities based upon the simulation result of the switch level simulator 104 and a test result of the tester 105.

Referring now to drawings, the operation of the failure diagnosing apparatus for the semiconductor integrated circuit, according to the fifth embodiment, will be described.

Figure 25:
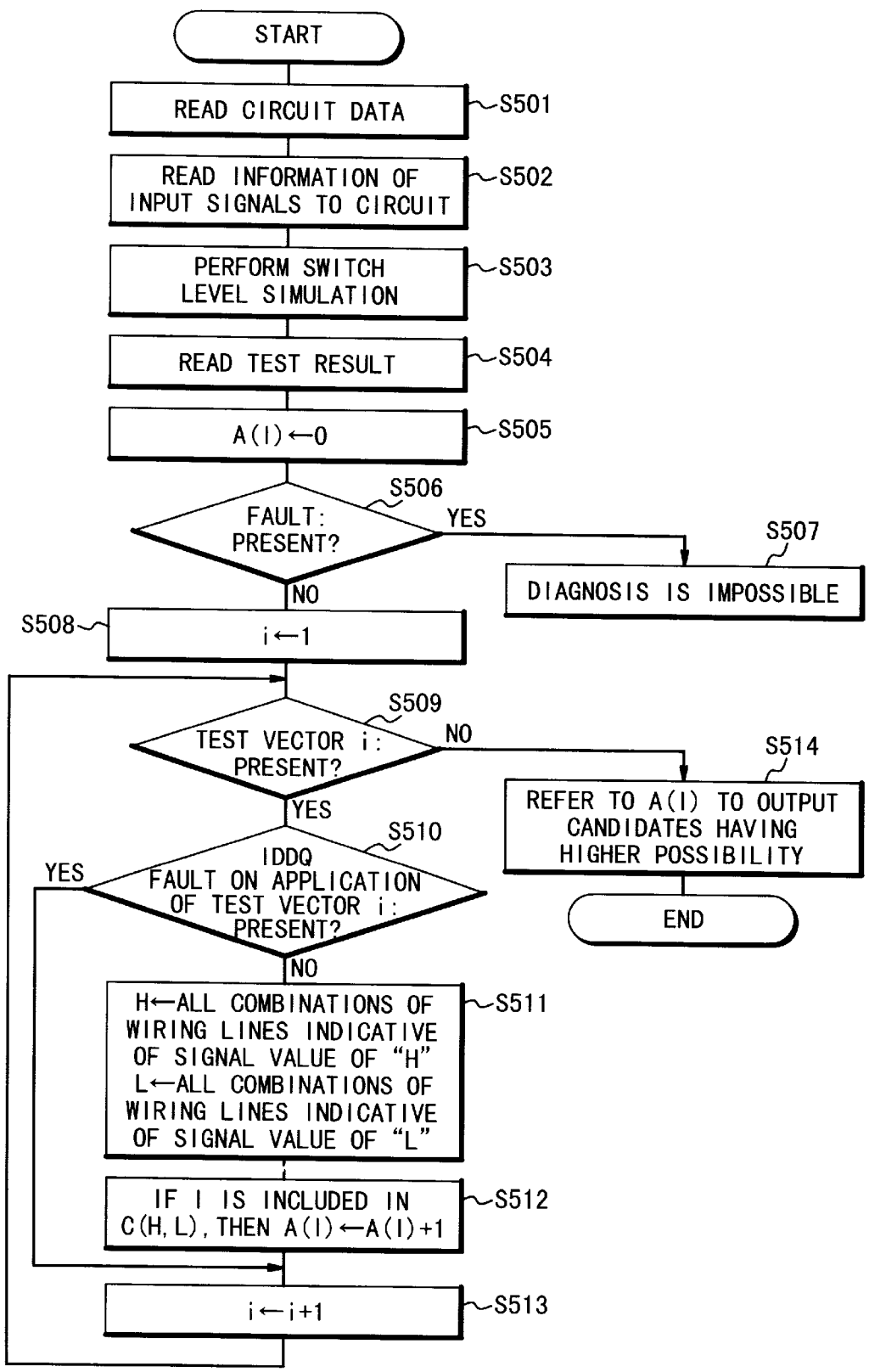
FIG. 25 is a flow chart for describing a sequential operation of the failure diagnosing apparatus according to the fifth embodiment of the present invention.

FIG. 25 is a flow chart for describing a sequential operation of the failure diagnosing apparatus for the semiconductor integrated circuit, according to the fifth embodiment of the present invention. It should be noted that since the processes defined from a step S501 to a step S504 shown in FIG. 25 are the same as those defined from the step S101 to the step S104 in the first embodiment, the explanation thereof is omitted.

In FIG. 25, after the processes defined from the step S501 to the step S504 are completed, the failure diagnosing unit 109 defines a variable A(I) where "I" is a failure candidate. Then, the failure diagnosing unit 109 set "0" as an initial value for the variable A(I) (step S505)

Next, the failure diagnosing unit 109 judges whether or not a functional fault happens to occur in the DUT 106 based upon the test result by the tester 105 (step S506). When the functional fault happens to occur, the failure diagnosing unit 109 judges that "failure diagnosis is impossible", and accomplishes the process (step S507).

On the other hand, when no functional fault happens to occur, the process of a step S508 is carried out. At the step S508, after the initial value of "1" is set to the pointer variable "i", the failure diagnosing unit 109 determines whether or not a test vector specified by the pointer variable "i" is the test vector to be processed (step S509). Subsequently, the failure diagnosing unit 109 judges whether or not an IDDQ fault happens to occur in association with this test vector (step S510). When it is determined that any IDDQ fault happens to occur in association with this test vector, the process advances to a step S513. When it is determined that any IDDQ fault does not happen to occur in association with this test vector, the failure diagnosing unit 109 sets a set "H" of wiring lines which are in the logic states of "H" and also another set "L" of wiring lines which are in the logic states of "L", as in the first embodiment (step S511).

Next, when the failure candidate "I" is involved in the set C(H,L), the relevant value of the variable A (I) is incremented by "1" (step S512). In other words, in the first embodiment, the combinations of the wiring lines between which the occurrence of any failure is not suspected are removed from the set "A" of failure candidates. However, in accordance with this fifth embodiment, a total number of such judgment results that the occurrence of any failure is not suspected is counted, instead of removing the combinations of the wiring lines from the set "A" of failure candidates.

Finally, the pointer variable "i" is incremented by "1" (step S513), and the process is returned to the step S509 at which the process defined from the step S509 to the step S513 are repeatedly performed.

Then, when confirmation is made that the processes associated with all of the test vectors are completed in the process defined at the step S509, the values of the variable A(I) are finally checked. Thus, the combinations of the wiring lines having the small variable values are sequentially outputted as the failure candidates with higher possibilities of the short circuit failures (step S514).

Next, using the DUT 106 shown in FIG. 3 as an example in the same manner as in the first embodiment, the operation of the failure diagnosing apparatus for the semiconductor integrated circuit, according to the fifth embodiment, will now be described with reference to FIG. 26 to FIG. 29B.

FIG. 26 is a diagram for showing a test result obtained when the test vectors of FIG. 4 are applied to the DUT 106 indicated in FIG. 3. FIG. 27A to FIG. 29B are diagrams for representing the sets of failure candidates used to explain the processes of the failure diagnosing apparatus for the semiconductor integrated circuit, according to the fifth embodiment of the present invention.

It should be noted that, in this fifth embodiment, as indicated in FIG. 26, an IDDQ fault is erroneously detected due to noise and circuit conditions (namely, when test vector 4 is applied).

Figures 27A, 27B:
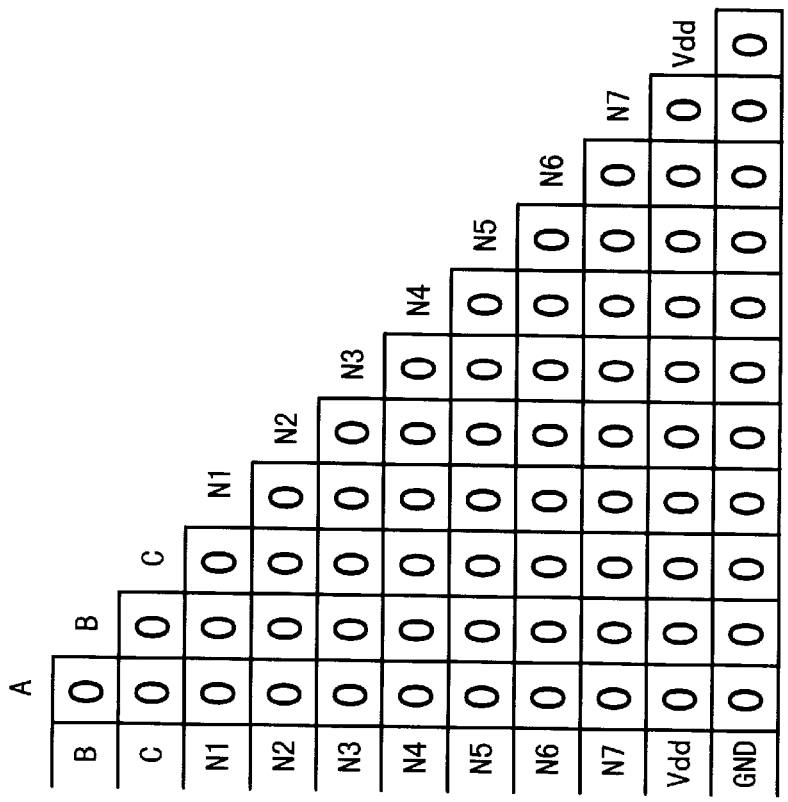
FIG. 27A is a diagram for representing a test result obtained when the test vectors are applied to the DUT and FIG. 27B is a diagram for representing the sets of failure candidates used to explain the processes of the failure diagnosing apparatus according to the fifth embodiment of the present invention.

In the process of the step S505, the variable A(I) defined by the failure diagnosing unit 109 is illustrated in FIG. 27B. FIG. 27A is a diagram for representing a test result obtained when the test vectors are applied to the DUT 106. Also, FIG. 28A is a diagram for representing a test result obtained when the test vectors are applied to the DUT 106. FIG. 28B represents a process result that "1" is added to each of the combinations of the wiring lines between which the occurrence of any failure is not suspected, in accordance with the processes of the step S509 to the step S513 for the test vector 1. Similarly, FIG. 29A is a diagram for representing a test result obtained when the test vectors are applied to the DUT 106. FIG. 29B represents a process result that "1" is added to each of the combinations of the wiring lines between which the occurrence of any failure is not suspected, in accordance with the processes of the step S509 to the step S513 for the test vector 2. As to the test vectors 3 and 4, since the IDDQ faults are detected, the above-explained processes are not performed.

As a consequence, ones, which have finally the smallest value, of the combinations as elements of the variable A(I) are outputted as the failure candidates with the highest possibility of the short circuit failure. That is, the combinations of wiring lines indicated as "0" in FIG. 29B (for example, combination between wiring lines B and C, or combination between wiring lines A and N4) are outputted as the failure candidates with the highest possibility of the short circuit failure.

Next, the combinations between wiring lines having elements of the variable A(I) indicated as "1" in FIG. 29B are outputted as the failure candidates with the second highest possibility of the short circuit failure are outputted (step S514). These are, for instance, combinations between wiring lines A and B, and combinations between wiring lines C and N1.

As a result, in accordance with this fifth embodiment, the failure candidates are sequentially indicated in the order of the failure candidates having the higher possibilities of the short circuit failures, even when the IDDQ test by the tester 105 is erroneously performed. Therefore, the failure occurrence positions can be correctly estimated. In this manner, it is possible to avoid an erroneous diagnosis that the wiring lines between which the short circuit failure does not occur is displayed as the failure occurrence position.

Next, referring now to drawings, the failure diagnosing apparatus according to the sixth embodiment of the present invention will be explained.

The structure of the failure diagnosing apparatus for the semiconductor integrated circuit, according to this sixth embodiment is the same as that of the first embodiment. The difference point between the sixth embodiment and the first embodiment is in that the processes executed by the failure diagnosing unit 109 is different from that of the first embodiment. Therefore, the description of the structure of the failure diagnosing apparatus according to the sixth embodiment is omitted by allocating the same reference numerals as those of the first embodiment to the components of the failure diagnosing apparatus in the sixth embodiment.

The failure diagnosing unit 109 of this sixth embodiment can continuously execute a judgment process without stopping a failure diagnosis even when any functional fault is detected based on the test result by the tester 105. In other words, according to this sixth embodiment, when the functional fault is detected in association with a test vector, the process of reducing the number of failure candidates is not carried out in association with a preselected number (q) of test vectors which appear before the test vector, and a predetermined number (p) of test vectors which appear after the test vector, unlike the first embodiment. The process of reducing the number of failure candidates is carried out in association with other test vectors, in association with which any functional fault is not detected, and out of a range of test vectors of the preselected numbers of test vectors, like the first embodiment.

This is because even when the test vector is used in association with which any functional fault is detected, the operation of the DUT 106 can be correctly simulated except for a predetermined range of test vectors appearing before or after the test vector.

Next, referring now to drawings, the operation of the failure diagnosing apparatus for the semiconductor integrated circuit, according to the sixth embodiment, will be described.

Figure 30:
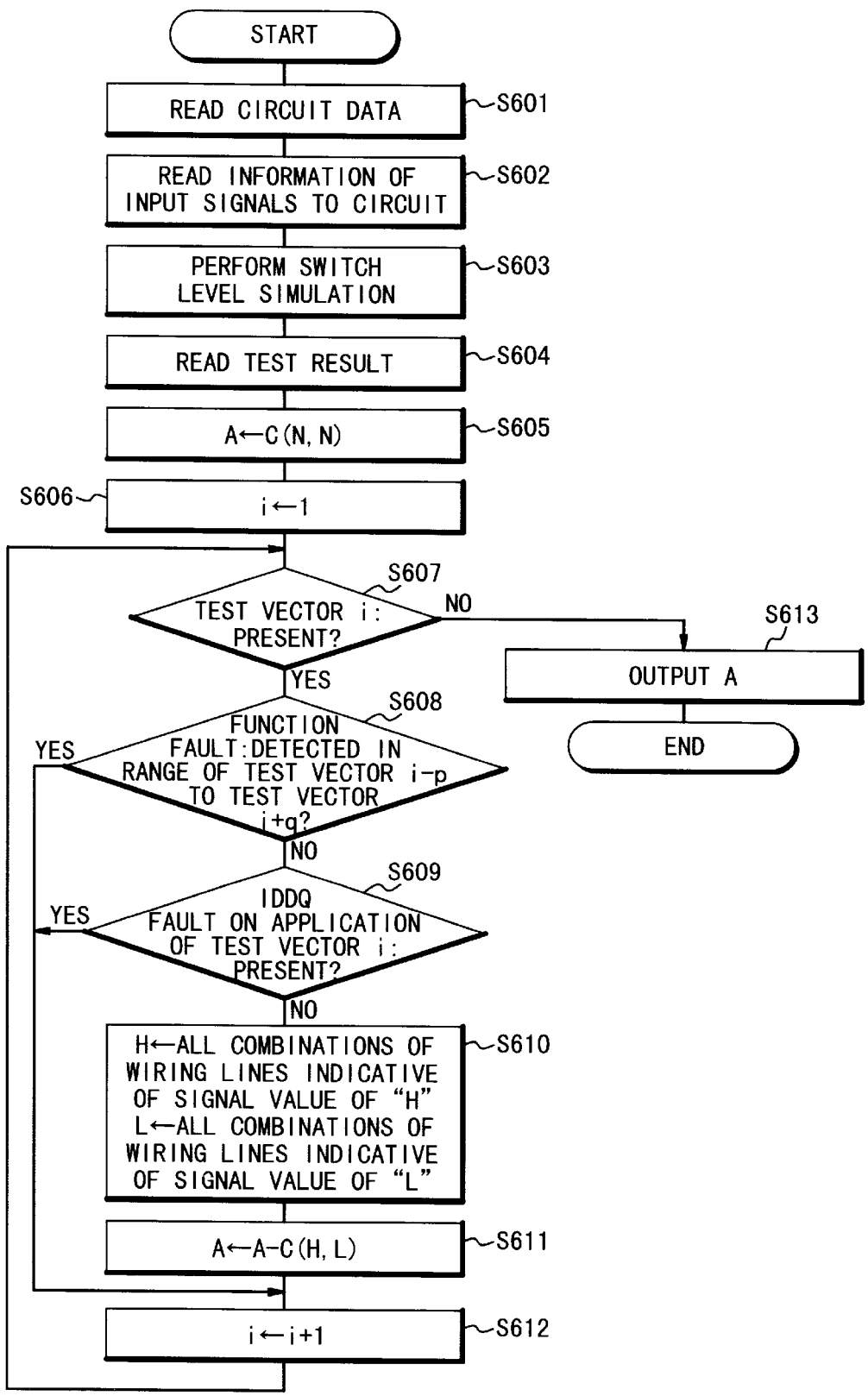
FIG. 30 is a flow chart for describing the sequential operation of the failure diagnosis apparatus according to the sixth embodiment of the present invention.

FIG. 30 is a flow chart for describing the sequential operation of the failure diagnosis apparatus for the semiconductor integrated circuit, according to the sixth embodiment of the present invention. Also, FIG. 31 is a diagram for indicating one example of a simulation result, functional test result, and IDDQ test result of the DUT 106. It should be noted that the operation defined from a step S601 to a step S605 of FIG. 30 are the same as those defined from the step S101 to the step S105 of the first embodiment. Therefore, the description thereof is omitted.

In FIG. 30, when the processes defined from the step S601 to the step S605 are accomplished, the failure diagnosing unit 109 sets an initial value of "1" as a pointer variable "i" indicative of the number of test vector (step S606).

Next, the failure diagnosing unit 109 judges whether or not the test vector specified by the pointer variable "i" is the test vector to be processed (step S607). In the case that the test vector specified by the pointer variable "i" is not the test vector to be processed, it can be judged that the processes for all of the test vectors are accomplished. As a result, the diagnosis result is outputted (step S613), and the failure diagnosing process is completed.

On the other hand, in the case that the test vector specified by the pointer variable "i" is the test vector to be processed, the failure diagnosing unit 109 judges whether or not any functional fault happens to occur in a range of the test vectors from a test vector corresponding to a pointer variable "i−p" up to another test vector corresponding to a pointer variable "i+q" (step S608).

In this case, when any functional fault is not detected, the failure diagnosing unit 109 determines whether or not any IDDQ fault happens to occur in the relevant test vector in the same manner as in the steps S110 to S112 of the first embodiment (step S609). If the IDDQ fault is not detected, then a set "H" of wiring lines which are in the logic state of "H", and also another set "L" of wiring lines which are in the logic state of "L" are set (step S610) to obtain the set C(H,L). This set C(H,L) is removed from the set "A" of failure candidates which has been defined in the previous process, and then the set "A" of failure candidates is again defined (step S611). Finally, the pointer variable "i" is incremented by "1" (step S612), and then the process is returned to the step S607 at which the processes defined from the step S607 to the step S612 are repeatedly performed.

On the other hand, when the functional fault is detected at the step S608, the process of a step S612 is carried out at which the pointer variable "i" is incremented by "1".

In this case, for example, a simulation result of the switch level simulator 104, functional test by the tester 105, and test result of IDDQ test of the DUT 106 are represented in FIG. 31. It is assumed that q=10 and p=5 are set, and the functional fault is detected by a test vector 100. In this case, the failure diagnosing unit 109 executes the process of reducing the number of failure candidates by checking whether or not the IDDQ fault happens to occur in association with the test vectors 1 through 89.

Next, when the pointer variable i is 90, the failure diagnosing unit 109 detects the functional fault in association with the test vector 100 in the process defined at the step S608. In this case, the process advances to a step S612 at which the pointer variable "i" is incremented by "1" (step S612).

Thereafter, the same process as described above is repeatedly performed to the test vectors corresponding to the pointer variables of "i"=91 up to "i"=105. Then, the processes defined from the step S609 to the step 611 are performed after the pointer variable i=106.

The set "A" of failure candidates is finally outputted by repeatedly performing the above-described processes in association with the subsequent test vectors up to the final test vector (step S613).

As a result, in accordance with this sixth embodiment, even when the functional fault is detected, the failure diagnosis can be carried out. Therefore, a failure diagnosis can be performed for a large number of failure devices with a short time.

In the above description, the process defined in the step S609 and the subsequent processes have been performed in the same manner as those of the first embodiment. Alternatively, these processes may be carried out in the same manner as those of either the second embodiment or the fifth embodiment. Also, in a case that the layout data storage unit is employed in the failure diagnosing apparatus for the semiconductor integrated circuit, these processes may be performed in the same manner to that of the third embodiment. When the fault position estimating unit 112 is additionally employed in this failure diagnosing apparatus, these processes may be carried out in the same manner to that of the fourth embodiment.

Next, the failure diagnosing apparatus according to the seventh embodiment of the present invention will now be explained with reference to drawings.

Figure 32:
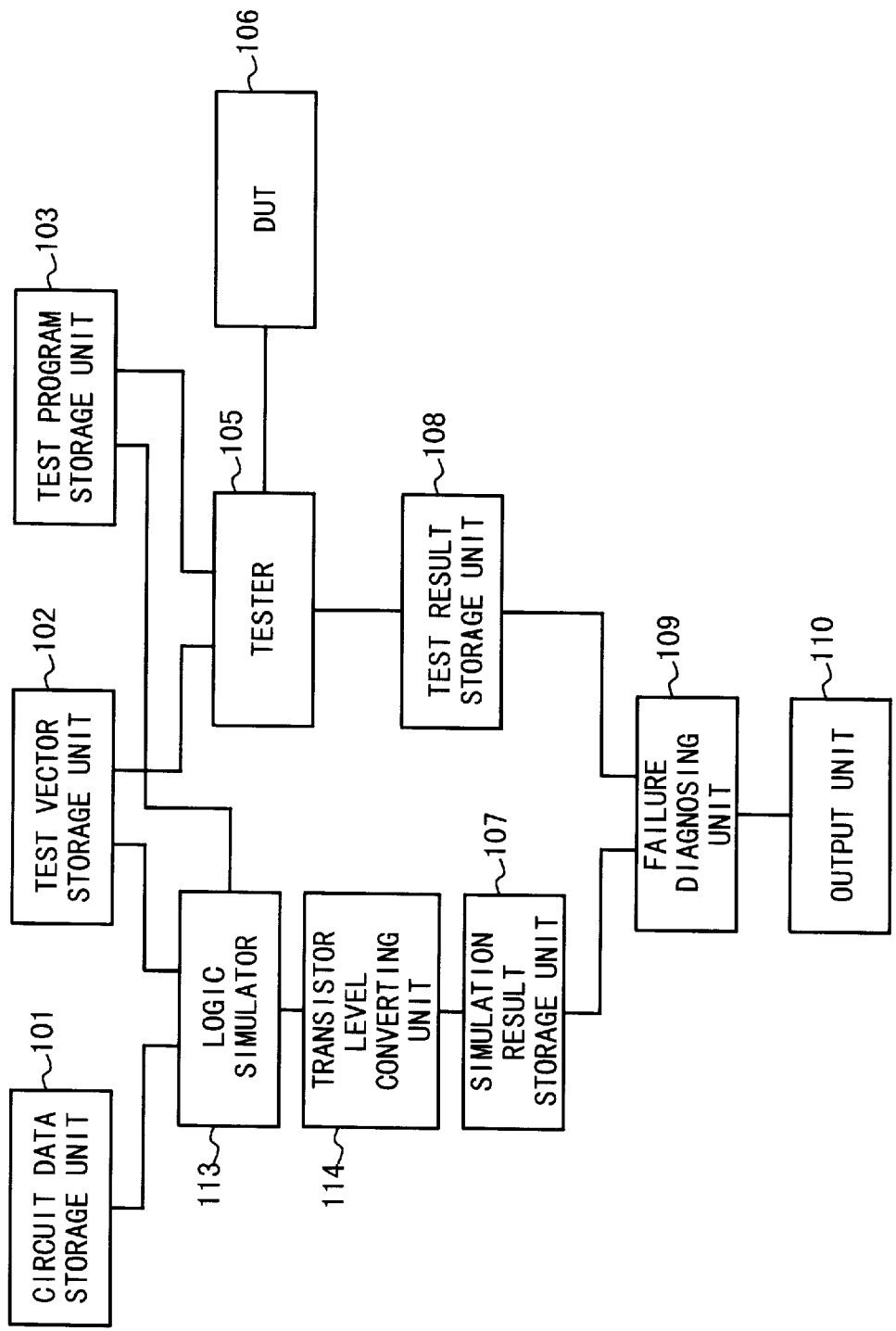
FIG. 32 is a schematic block diagram for representing the structure of the failure diagnosing apparatus according to a seventh embodiment of the present invention.

FIG. 32 is a schematic block diagram for representing the structure of the failure diagnosing apparatus for an semiconductor integrated circuit, according to a seventh embodiment of the present invention.

In FIG. 32, the failure diagnosing apparatus for the semiconductor integrated circuit, according to this seventh embodiment, includes a logic simulator 113 and a transistor level converting unit 114 instead of the above-explained switch level simulator 104 employed in the first embodiment. The logic simulator 113 simulates the operation of the DUT 106 in units of logic gated (namely, in a logic gate level). Also, the transistor level converting unit 114 acquires a state value in a transistor level from the simulation result of the logic simulator 113.

Referring now to drawings, a description will be made of the operation of the failures diagnosing apparatus for the semiconductor integrated circuit, according to the seventh embodiment.

Figure 33:
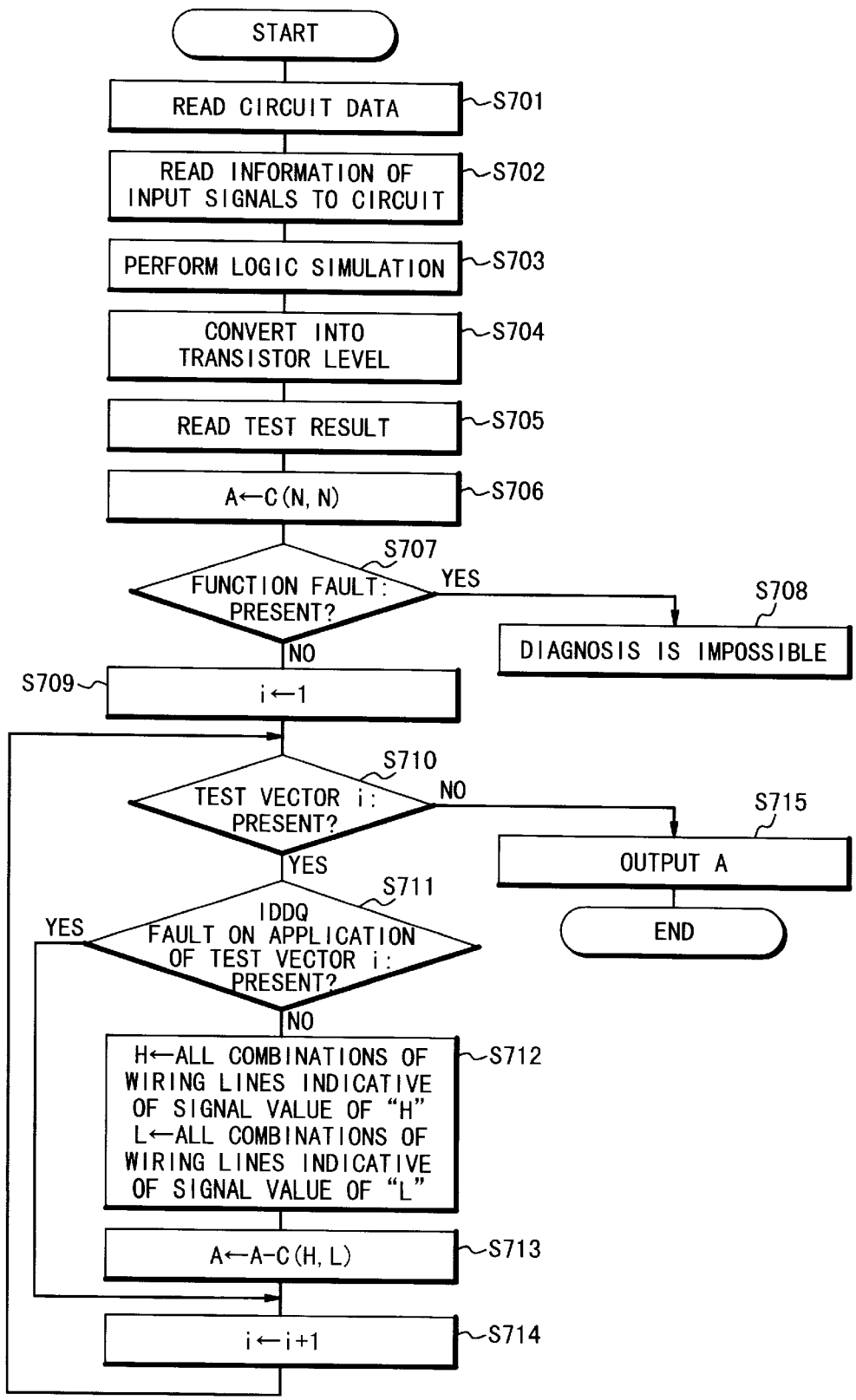
FIG. 33 is a flow chart for describing a sequential operation of the failure diagnosing apparatus according to the seventh embodiment of the present invention.

FIG. 33 is a flow chart for describing a sequential operation of the failure diagnosing apparatus for the semiconductor integrated circuit, according to the seventh embodiment of the present invention. It should be noted that the processes defined from a step S705 to a step S715 of FIG. 33 are the same as those defined from the step S104 to the step S114 of the first embodiment. Therefore, the explanation thereof is omitted.

In this seventh embodiment, instead of the above-described switch level simulator, the logic simulator 113 reads circuit data (logic gate levels) of the DUT 106 stored in the circuit data storage unit 101 (step S701). The logic simulator 113 further reads input/output signal information stored in the test vector storage unit 102 and also the test conditions stored in the test program storage unit 103 (step S702). Subsequently, this logic simulator 113 simulates the operation of this DUT 106 in the logic gate level based on the above-explained various types of information.

On the other hand, the transistor level converting unit 114 acquires the operation of the DUT 106 in the transistor level from the simulation results of the logic simulator 113 (step S704). Based upon the acquired circuit operation information in the transistor level of the DUT, the process similar to that of the first embodiment is carried out in order to reduce the number of failure candidates.

Next, referring now to FIG. 34A to FIG. 37, the operation of the failure diagnosing apparatus for the semiconductor integrated circuit, according to the seventh embodiment, will be explained.

Figures 34A, 34B:
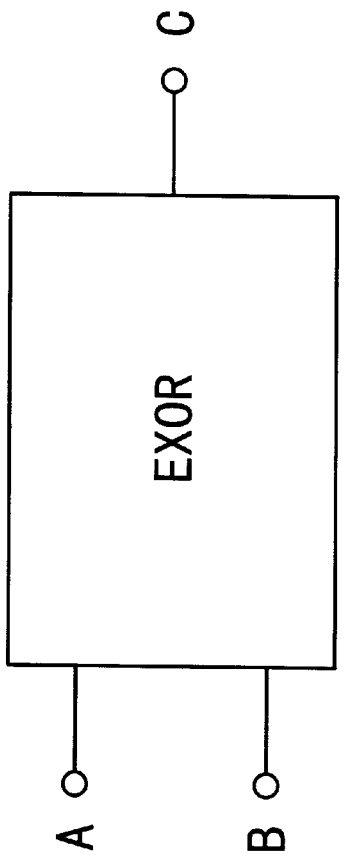
FIG. 34A is a circuit diagram for indicating a structural example of the DUT shown in FIG. 3 in a gate level and FIG. 34B is a diagram for representing a test result obtained when the test vectors are applied to the DUT.

FIG. 34A is a circuit diagram for indicating a structural example of the DUT 106 shown in FIG. 3 in the gate level. FIG. 34B is a diagram for representing a test result obtained when the test vectors are applied to the DUT 106. FIG. 35 represents a simulation result in the gate level, used to describe the process of the failure diagnosing apparatus for the semiconductor integrated circuit, according to the seventh embodiment of the present invention. Also, FIG. 36 represents a simulation result in the transistor level, used to describe the process of the failure diagnosing apparatus for the semiconductor integrated circuit, according to the seventh embodiment of the present invention.

The circuit data of the DUT 106 in the logic gate level, and a table for showing a relationship between the respective input/output terminals and internal states, which are shown in FIGS. 34A and 34B, are stored in the circuit data storage unit 101.

The logic simulator 113 reads the circuit data of the DUT 106 and the test vectors so as to simulate the operation of the DUT 106 in the logic gate level (step S703).

A simulation result by the logic simulator 113 is indicated in FIG. 35. The simulation result shown in FIG. 35 is supplied to the transistor level converting unit 114. Then, the transistor level converting unit 114 acquires the circuit operation of the DUT 106 in the transistor level with reference to the table shown in FIG. 36 (step S704). A process result by the transistor level converting unit 114 is represented in FIG. 37.

Subsequently, the processes defined from a step S705 to a step S715 are preformed to reduce the number of failure candidates of the DUT 106 in the manner as that of the first embodiment. Then, the set "A" of failure candidates is finally outputted.

As a consequence, in accordance with this seventh embodiment, the circuit operation of the DUT 106 is grasped, while the logic simulator 113 is employed and further the simulation result is utilized so as to check the logic states of all of the wiring lines in the DUT 106. Therefore, the highspeed failure diagnosis can be done, and the failure diagnosing time can be shortened.

In the above description, the process defined in the step S705 and the subsequent processes have been performed in the same manner as those of the first embodiment. Alternatively, these processes may be carried out in the same manner as those of the second embodiment, the fifth embodiment, or the sixth embodiment. Also, in a case that the layout data storage unit 111 is employed in the failure diagnosing apparatus for the semiconductor integrated circuit, these processes may be performed in the same manner as those of the third embodiment. When the fault position estimating unit 112 is additionally employed in this failure diagnosing apparatus, these processes may be carried out in the same manner as those of the fourth embodiment.

It should be understood that the above-explained various processes executed in the switch level simulator 104, the logic simulator 113, the transistor level converting unit 114, the tester 105, the failure diagnosing unit 109, and the fault position estimating unit 112, among the structure employed in the respective embodiments, may be carried out in a computer equipped with a CPU. In this alternative case, this computer owns a recording medium on which a process program used to execute the failure diagnosis has been recorded. Thus, the respective sequential process of the above-described failure diagnosis are executed in accordance with the process program recorded on this recording medium. It should be understood that as this recording medium, a magnetic disk, a semiconductor memory, or other recording media may be employed.

As previously described in detail, since the failure diagnosing apparatus for the semiconductor integrated circuit is arranged to have the above-explained arrangements, there are the following advantages.

In the failure diagnosing apparatus for the semiconductor integrated circuit according to the first aspect of the present invention, the failure occurrence positions can be estimated by executing the processes by the computer. Therefore, these failure occurrence positions can be estimated without opening the device under test. Thus, the failure diagnosis can be accomplished within a short time duration.

Also, in the failure diagnosing apparatus for the semiconductor integrated circuit according to the second aspect of the present invention, since the high speed failure diagnosis can be carried out, the diagnosing time can be shortened.

Also, in the failure diagnosing apparatus for the semiconductor integrated circuit according to the third aspect of the present invention, in the case that the failure occurred in the device under test is a single failure, the failure occurrence position can be more precisely discriminated. As a result, the failure occurrence position can be more correctly estimated.

Also, in the failure diagnosing apparatus for the semiconductor integrated circuit according to the fourth aspect of the present invention, a combination between the circuit wiring lines located apart from the circuit wiring lines where the possibility of the failure is very low can be removed in advance. Therefore, the number of failure candidates can be further precisely reduced. As a result, the failure candidates can be more correctly estimated.

Also, in the failure diagnosing apparatus for the semiconductor integrated circuit according to the fifth aspect of the present invention, the detailed failure analysis can be done within a short time by the various analyzing/solving apparatus.

Further, in the failure diagnosing apparatus for the semiconductor integrated circuit according to the sixth aspect of the present invention, since the failure candidates are sequentially displayed in the order of the higher possibility of occurrences of short circuit failures. As a result, it is possible to avoid erroneous diagnosis that the wiring line where no failure happens to occur is displayed as the failure occurrence position.

Moreover, in the failure diagnosing apparatus for the semiconductor integrated circuit according to the seventh aspect of the present invention, when the functional fault is detected in the function test, the diagnosing process is stopped for a preselected range of test vectors. As a consequence, even when the functional fault is detected, the failure diagnosis can be executed, and therefore, a large number of failure can be diagnosed.

What is claimed is:

1. A method of diagnosing a test circuit device, comprising the steps of:
    simulating an operation of a test circuit device using a set of test vectors to produce a simulation result;
    testing said test circuit device using said set of test vectors to produce a test result;
    defining a first set of combinations of circuit elements based on a circuit data of said test circuit device, said test circuit device being composed of said circuit elements;
    estimating a final set of failure candidates from said first set of combinations in a failure diagnosing process based on said simulation result and said test result for each of said test vectors; and
    outputting said final set of failure candidates
    wherein said defining step includes:
        defining said first set of combinations of every two of said circuit elements based on said circuit data of said test circuit device;
        selecting combinations of said circuit elements based on a layout data of said test circuit device such that any failure does not occur, to define a second set of said selected combinations; and
        removing said second set from said first set to redefine said first set of combinations.

2. A method according to claim 1, wherein said simulating step includes:
    simulating the operation of said test circuit device in a gate level based on said circuit data and said test vectors to produce gate level simulation result; and
    converting said gate level simulation result into said simulation result in a transistor level.

3. A method according to claim 1, wherein said estimating step further includes:
    relating each of said failure candidates of said final set to a position on a layout of said test circuit device based on a layout data, and
    wherein said outputting step includes outputting said final set of failure candidates and said positions.

4. A method according to claim 3, wherein said outputting step includes:
    displaying said layout;
    displaying said positions on said layout; and
    displaying messages corresponding to said failure candidates of said final set.

5. A method according to claim 1, wherein said estimating step includes:
    (a) determining a third set of combinations of said circuit elements in which a failure does not occur, based on said simulation result for a specific test vector;
    (b) removing said third set of combinations from said first set of combinations to redefine said first set of combinations; and
    (c) repeating said steps (a) and (b) while changing said specific test vector over said test vectors.

6. A method according to claim 1, wherein said estimating step includes:
    (d) determining a third set of combinations of said circuit elements in which a failure does not occur, based on said simulation result for a specific test vector;
    (e) removing said third set of combinations from said first set of combinations to redefine said first set of combinations; and
    (f) repeating said steps (d) and (e) while changing said specific test vector over ones of said test vectors other than a predetermined range of test vectors,
    wherein said estimating step further includes:
        determining whether any functional fault is present, based on said test result for each of said test vectors; and
        when it is determined that any functional fault is present for at least one of said test vectors, determining said predetermined range of test vectors such that said predetermined range of test vectors include said at least one test vector.

7. A method according to claim 1, wherein said estimating step includes:
    (g) initializing values for said combinations of said first set;
    (h) determining a third set of combinations of said circuit elements in which a failure does not occur, based on said simulation result for a specific test vector;
    (i) incrementing said values for ones of said combinations of said first set corresponding to said combinations of said third set; and
    (j) repeating said steps (h) and (i) while changing said specific test vector over said test vectors.

8. A method according to claim 7, wherein said estimating step includes
    determining said final set of failure candidates in order of combinations having smaller values.

9. A method according to claim 1, wherein said estimating step includes:
    (k) initializing values for said combinations of said first set;

(l) determining a third set of combinations of said circuit elements in which a failure does not occur, based on said simulation result for a specific test vector;

(m) incrementing said values for ones of said combinations of said first set corresponding to said combinations of said third set; and (n) repeating said steps (l) and (m) while changing said specific test vector over ones of said test vectors other than a predetermined range of test vectors wherein said estimating step further includes:
determining whether any functional fault is present, based on said test result for each of said test vectors; and
when it is determined that any functional fault is present for at least one of said test vectors, determining said predetermined range of test vectors such that said predetermined range of test vectors include said at least one test vector.

10. A method according to claim 9, wherein said estimating step includes
determining said final set of failure candidates in order of combinations having smaller values.

11. A method according to claim 1, further comprising the steps of:
determining whether any functional fault is present, based on said test result for each of said test vectors; and
stopping said estimating step and said outputting step when it is determined that any functional fault is present for either one of said test vectors, and
wherein said estimating step is executed when it is determined that any functional fault is not present for each of said test vectors.

12. A method according to claim 11, wherein said estimating step includes:
determining a fourth set of circuit elements, which satisfy a first predetermined potential condition, based on said simulation result for said specific test vector;
determining a fifth set of circuit elements, which satisfy a second predetermined potential condition, based on said simulation result for said specific test vector;
determining a third set of combinations based on each of said circuit elements of said fourth set and each of said circuit elements of said fifth set; and
removing said third set of combinations from said first set of combinations to redefine said first set of combinations.

13. A method according to claim 14, wherein said estimating step includes:
determining whether a power source queiscent current fault is present when each of said test vectors is applied, based on said test result;
continuing said failure diagnosing process when it is determined that the power source queiscent current fault is not present.

14. A method of diagnosing a test circuit device, comprising the steps of:
simulating an operation of a test circuit device using a set of test vectors to produce a simulation result:
testing said test circuit device using said set of test vectors to produce a test result;
defining a first set of combinations of circuit elements based on a circuit data of said test circuit device, said test circuit device being composed of said circuit elements;

estimating a final set of failure candidates from said first set of combinations in a failure diagnosing process based on said simulation result and said test result for each of said test vectors; and
outputting said final set of failure candidates,
wherein said estimating step further includes:
(o) determining a third set of combinations of said circuit elements in which any failure does not occur, based on said simulation result for a specific test vector, when it is determined that the power source queiscent current fault is present; and
(p) calculating a product of said first set and said second set to redefine the calculating result as said first set when it is determined that the power source queiscent current fault is present.

15. A failure diagnosing apparatus for a semiconductor integrated circuit device, comprising:
a circuit data storage unit for storing a circuit data of a semiconductor integrated circuit device;
a test vector storage unit for storing test vectors for said semiconductor integrated circuit device;
a simulating unit for simulating an operation of said semiconductor integrated circuit device using said test vectors to produce a simulation result;
a testing unit for testing said semiconductor integrated circuit device using said test vectors to produce a test result;
a diagnosing unit for defining a first set of combinations of circuit elements based on said circuit data of said semiconductor integrated circuit device, said semiconductor integrated circuit device being composed of said circuit elements, for estimating a final set of failure candidates from said first set of combinations in a failure diagnosing process while reducing a number of combinations of said first set based on said simulation result and said test result for each of said test vectors;
an output unit for outputting said final set of failure candidates; and
a layout data storage unit for storing a layout data of said semiconductor integrated circuit device,
wherein said diagnosing unit defines said first set of combinations of every two of said circuit elements based on said circuit data of said semiconductor integrated circuit device, selects combinations of said circuit elements based on said layout data of said semiconductor integrated circuit device such that any failure does not occur, to define a second set of said selected combinations, and removes said second set from said first set to redefine said first set of combinations.

16. A failure diagnosing apparatus according to claim 15, wherein said simulating unit includes:
a logic simulating unit for simulating the operation of said test circuit device in a gate level based on said circuit data and said test vectors to produce gate level simulation result; and
a converting unit for converting said gate level simulation result into said simulation result in a transistor level.

17. A failure diagnosing apparatus according to claim 15, wherein said diagnosing unit further relates each of said failure candidates of said final set to a position on a layout of said semiconductor integrated circuit device based on said layout data, and
wherein said output unit outputs said final set of failure candidates and said positions.

18. A failure diagnosing apparatus according to claim 17, wherein said output unit displays said layout, said positions on said layout, and messages corresponding to said failure candidates of said final set.

19. A failure diagnosing apparatus according to claim 15, wherein said diagnosing unit determines whether any functional fault is present, based on said test result for each of said test vectors, and stops the failure diagnosing process when it is determined that any functional fault is present for either one of said test vectors, and continues the failure diagnosing process when it is determined that any functional fault is not present for each of said test vectors.

20. A failure diagnosing apparatus according to claim 19, wherein said diagnosing unit performs a determining operation of a third set of combinations of said circuit elements in which a failure does not occur, based on said simulation result for a specific test vector, and a removing operation of said third set of combinations from said first set of combinations to redefine said first set of combinations, and repeats said determining operation and said removing operation while changing said specific test vector over at least a portion of said test vectors.

21. A failure diagnosing apparatus according to claim 20, wherein said at least a portion of said test vectors is ones of said test vectors other than a predetermined range of test vectors, wherein said diagnosing unit determines whether any functional fault is present based on the test result for each of said test vectors, and if a functional fault is determined for any one of the test vectors, said predetermined range of test vectors is determined to include said one of the test vectors.

22. A failure diagnosing apparatus according to claim 20, wherein said diagnosing unit performs a first determining operation of a fourth set of circuit elements, which satisfy a first predetermined potential condition, based on said simulation result for said specific test vector, a second determining operation of a fifth set of circuit elements, which satisfy a second predetermined potential condition, based on said simulation result for said specific vector, a third determining operation of a third set of combinations based on each of said circuit elements of said fourth set and each of said circuit elements of said fifth set, and a removing operation of said third set of combinations from said first set of combinations to redefine said first set of combinations, and repeats said first to third determining operations and said removing operation while changing said specific test vector over at least a portion of said test vectors.

23. A failure diagnosing apparatus according to claim 20, wherein said diagnosing unit determines whether a power source quiescent current fault is present when each of said test vectors is applied, based on said test result, and executes the failure diagnosing process.

24. A failure diagnosing apparatus for a semiconductor integrated circuit device, comprising:

a circuit data storage unit for storing a circuit data of a semiconductor integrated circuit device;

a test vector storage unit for storing test vectors for said semiconductor integrated circuit device;

a simulating unit for simulating an operation of said semiconductor integrated circuit device using said test vectors to produce a simulation result;

a testing unit for testing said semiconductor integrated circuit device using said test vectors to produce a test result;

a diagnosing unit for defining a first set of combinations of circuit elements based on said circuit data of said semiconductor integrated circuit device, said semiconductor integrated circuit device being composed of said circuit elements, for estimating a final set of failure candidates from said first set of combinations in a failure diagnosing process while reducing a number of combinations of said first set based on said simulation result and said test result for each of said test vectors; and an output unit for outputting said final set of failure candidates, wherein said diagnosing unit determines whether any functional fault is present, based on said test result for each of said test vectors, a process when it is determined that any functional fault is present for either one of said test vectors, and continues the failure diagnosing process when it is determined that any functional fault is not present for each of said test vectors, wherein said diagnoding unit performs a determining operationof a third set of combinations of said circuit element in which a failure does mot occur, based on said simulation result for a specifice test vector, and a removing operation of said third set of combinations from said first set of combinations to redefine said first set of combinations, and repeats said determining operation and said removing operation while changeng said specific test vector over at least a portion of said test vectors, and wherein said deagnosing unit further determines a third set of combinations of said circuit elements in which any failure does not occur, based on said simulation result for a specific test vector, when it is determined that the power source quiescent current fault is present, and calculates a product of said first set and said second set to redefine the calculating result as said first set when it is determined that the power source quiescent current fault is pressent.

25. A failure diagnosing apparatus for a semiconductor integrated circuit device, comprising:

a circuit data storage unit for storing a circuit data of a semiconductor integrated circuit device;

a test vector storage unit for storing test vectors for said semiconductor integrated circuit device;

a simulating unit for simulating an operation of said semiconductor integrated circuit device using said test vectors to produce a simulation result;

a testing unit for testing said semiconductor integrated circuit device using said test vectors to produce a test result;

a diagnosing unit for defining a first set of combinations of circuit elements based on said circuit data of said semiconductor integrated circuit device, said semiconductor integrated circuit device being composed of said circuit elements, for estimating a final set of failure candidates from said first set of combinations in a failure diagnosing process while updating values corresponding to said combinations of said first set based on said simulation result and said test result for each of said test vectors;

an output unit for outputting said final set of failure candidates; and a layout data storage unit for storing a layout data of said semiconductor integrated circuit device, wherein said diagnosing unit defines said first set of combinations of every two of said circuit elements based on said circuit data of said semiconductor integrated circuit device, selects combinations of said circuit elements based on said layout data of said semicomductor integrated circuit device such that any failure does not occur, to difine a second set of said selected combinations, and removes said seconds set from said first set to redefine said first set of combinations.

26. A failure diagnosing apparatus according to claim 25, wherein said simulating unit includes:
   a logic simulating unit for simulating the operation of said test circuit device in a gate level based on said circuit data and said test vectors to produce gate level simulation result; and
   a converting unit for converting said gate level simulation result into said simulation result in a transistor level.

27. A failure diagnosing apparatus according to claim 25, wherein said diagnosing unit further relates each of said failure candidates of said final set to a position on a layout of said semiconductor integrated circuit device based on said layout data, and
   wherein said output unit outputs said final set of failure candidates and said positions.

28. A failure diagnosing apparatus according to claim 27, wherein said output unit displays said layout, said positions on said layout, and messages corresponding to said failure candidates of said final set.

29. A failure diagnosing apparatus according to claim 25, wherein said diagnosing unit performs an initializing operation of values for said combinations of said first set, a determining operation of a third set of combinations of said circuit elements in which a failure does not occur, based on said simulation result for a specific test vector, and an incrementing operation of said values for ones of said combinations of said first set corresponding to said combinations of said third set, and repeats said determining operation and said incrementing operation while changing said specific test vector over at least a portion of said test vectors.

30. A failure diagnosing apparatus according to claim 29, wherein said at least a portion of said test vectors is ones of said test vectors other than a predetermined range of test vectors,
   wherein said diagnosing unit determines whether any functional fault is present, based on said test result for each of said test vectors, and determines said predetermined range of test vectors such that said predetermined range of test vectors includes at least one test vector for which a functional fault is determined.

31. A failure diagnosing apparatus according to claim 29, wherein said diagnosing unit determines whether any functional fault is present, based on said test result for each of said test vectors, and stops the failure diagnosing process when it is determined that any functional fault is present for either one of said test vectors, and continues the failure diagnosing process when it is determined that any functional fault is not present for each of said test vectors.

32. A failure diagnosing apparatus according to claim 25, wherein said diagnosing unit performs a first determining operation of a fourth set of circuit elements, which satisfy a first predetermined potential condition, based on said simulation result for said specific test vector, a second determining operation of a fifth set of circuit elements, which satisfy a second predetermined potential condition, based on said simulation result for said specific vector, a third determining operation of a third set of combinations based on each of said circuit elements of said fourth set and each of said circuit elements of said fifth set, and a removing operation of said third set of combinations from said first set of combinations to redefine said first set of combinations, and repeats said first to third determining operations and said removing operation while changing said specific test vector over at least a portion of said test vectors.

33. A failure diagnosing apparatus according to claim 29, wherein said diagnosing unit determines whether a power source queiscent current fault is present when each of said test vectors is applied, based on said test result, and executes the failure diagnosing process.

* * * * *